US009362082B2

(12) United States Patent
Mukai

(10) Patent No.: US 9,362,082 B2
(45) Date of Patent: Jun. 7, 2016

(54) ELECTRON MICROSCOPE AND METHOD OF ADJUSTING MONOCHROMATOR

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/823,141

(22) Filed: Aug. 11, 2015

(65) Prior Publication Data

US 2016/0079030 A1     Mar. 17, 2016

(30) Foreign Application Priority Data

Aug. 11, 2014 (JP) ................................. 2014-163643

(51) Int. Cl.
H01J 47/00 (2006.01)
H01J 37/05 (2006.01)
H01J 37/21 (2006.01)

(52) U.S. Cl.
CPC H01J 37/05 (2013.01); H01J 37/21 (2013.01)

(58) Field of Classification Search
None
See application file for complete search history.

(56) References Cited

U.S. PATENT DOCUMENTS 5,097,126 A * 3/1992 Krivanek .............. H01J 37/261
                                                    250/305
6,670,611 B1 * 12/2003 Kruit ....................... H01J 37/05
                                                    250/288

FOREIGN PATENT DOCUMENTS

JP          2003331764 A    * 11/2003

* cited by examiner

Primary Examiner — Andrew Smyth
(74) Attorney, Agent, or Firm — The Webb Law Firm

(57) ABSTRACT

An electron microscope is offered which can facilitate adjusting a monochromator. The electron microscope (100) includes the monochromator (20) having an energy filter (22) for dispersing the beam (EB) according to energy and a slit plate (24) disposed on an energy dispersive plane. The slit plate (24) is provided with plural energy-selecting slits (25) which are different in width taken in a direction where the beam (EB) is dispersed. The microscope (100) further includes a lens system (30) on which the beam impinges after being monochromatized by the monochromator (20), a first measuring section (50) for measuring the intensity of the beam (EB) emitted from an electron beam source (10), a second measuring section (60) for measuring the intensity of the beam (EB) that has passed through an active one (25-L) of the energy-selecting slits (25), and a slit identifying portion (72) for identifying the active energy-selecting slit (25-L) from the plural energy-selecting slits (25) on the basis of the results of measurements made by the first and second measuring sections (50, 60).

12 Claims, 13 Drawing Sheets

ELECTRON MICROSCOPE AND METHOD OF ADJUSTING MONOCHROMATOR

BACKGROUND OF THE INVENTION

1. Field of the Invention

The present invention relates to an electron microscope and also to a method of adjusting a monochromator.

2. Description of Related Art

Monochromators are used to achieve higher resolution in electron energy loss spectroscopy (EELS) implemented in transmission electron microscopes. Furthermore, monochromators are used to reduce chromatic aberration such that a maximum amount of information carried by a transmission image is increased. In addition, monochromators are used to improve the resolution by reducing chromatic aberration in a scanning electron microscope when a monochromatized electron beam with a low accelerating voltage is used.

Various types of monochromators have been proposed. Generally, a monochromator is composed of an energy filter portion for spectrally dispersing an electron beam and projecting a spectrum and an energy selector portion for extracting a desired energy width of electron beam from the spectrum and monochromatizing the beam by making use of slits or the like.

The energy filter portion produces a deflecting field in the beam path of the electron beam to spectrally disperse the beam by making use of difference of the orbit depending on electron velocity in the deflecting field, and projects a spectrum. The dispersive power of the energy filter portion is approximately tens of μm/eV.

The energy selector portion needs to have slits which are designed taking account of both the required energy width of the monochromatized electron beam and the dispersive power of the energy filter portion. The slits are from microns to submicrons in width. The slits are grooves formed, for example, in a thin metal film. Plural slits which are different in width are formed in the thin metal film to permit one to select energy widths of the electron beam under plural modes of operation according to observation conditions of the microscope (see, for example, JPA-2003-331764). The thin metal film can be positionally controlled via a mechanical position moving mechanism. All the slit widths can be installed in the electron beam path. An electron beam of some energy is cut off by the slits. An electron beam of other energy passes through the slits. As a result, the electron beam is monochromatized according to the widths of the slits.

In the case of the aforementioned monochromator, when an electron beam has passed through a slit, it is impossible to directly confirm the shape of this slit from the beam. Therefore, a human operator cannot directly confirm what slit width is located in the beam path.

Therefore, where an image is observed at a different energy width after switching the slit width, the operator must mechanically move the thin metal film, count the number of actions of switching the slit width on his/her fingers, and check what slit width is located in the beam path. In this way, the monochromator has been cumbersome to handle for unskilled operators.

SUMMARY OF THE INVENTION

In view of the foregoing problem, the present invention has been made. One object associated with some aspects of the present invention is to provide an electron microscope permitting easy adjustment of a monochromator. Another object associated with some aspects of the invention is to provide a method capable of adjusting a monochromator easily.

(1) An electron microscope associated with the present invention comprises: an electron beam source emitting an electron beam; a monochromator having an energy filter for dispersing the electron beam according to energy and a slit plate disposed on an energy dispersive plane, the slit plate being provided with plural energy-selecting slits that are different in width taken in a direction where the electron beam is dispersed; a lens system on which the electron beam impinges after the beam is monochromatized by the monochromator; a first measuring section for measuring the intensity of the electron beam emitted from the electron beam source; a second measuring section for measuring the intensity of the electron beam that has passed through an active one of the energy-selecting slits; and a slit identifying portion for identifying the active energy-selecting slit through which the electron beam has passed from among the plural energy-selecting slits on the basis of results of measurements made by the first and second measuring sections.

In this electron microscope, the active energy-selecting slit through which the electron beam has passed can be identified. Therefore, when the monochromator is adjusted, this electron microscope dispenses with a conventional procedure, for example, consisting of counting the number of actions for switching the slit width on operator's fingers and identifying what slit width is installed in the beam path. Consequently, in this electron microscope, the monochromator can be adjusted easily.

(2) In one feature of this electron microscope, the slit identifying portion may find the width, WL, of the active energy-selecting slit using the following Eq. (1) and identify the active energy-selecting slit through which the electron beam has passed:

$$IL = \alpha \cdot WL \cdot It \qquad (1)$$

where IL is the intensity of the electron beam measured by the second measuring section, It is the intensity of the electron beam measured by the first measuring section, and α is a proportional constant.

In this electron microscope, the active energy-selecting slit through which the electron beam has passed can be easily identified.

(3) In another feature of this electron microscope, there are further provided: a moving mechanism for moving the position of the slit plate; and a slit position controller for controlling the moving mechanism. The slit position controller may perform an operation for makings a decision as to whether the active energy-selecting slit identified by the slit identifying portion is coincident with a desired one of the plural energy-selecting slits and an operation for controlling the moving mechanism on the basis of the result of the decision to move the position of the slit plate, for changing the active energy-selecting slit through which the electron beam passes.

In this electron microscope, an energy-selecting slit of a desired slit width can be placed in the electron beam path. Therefore, in this electron microscope, the monochromator can be adjusted easily.

(4) In one feature of the electron microscope set forth in the paragraph (3), the slit position controller may operate to control the moving mechanism on the basis of the results of measurements made by the second measuring section for adjusting the position of the active energy-selecting slit through which the electron beam has passed, the position being taken in the direction of dispersion.

In this electron microscope, adjustment of the position of the active energy-selecting slit taken in the direction of dispersion can be automated. Accordingly, in this electron microscope, an observation or analysis at an optimized electron beam brightness (e.g., at a high brightness) can be performed easily.

(5) In one feature of the electron microscope set forth in the paragraph (4) above, the plural energy-selecting slits are arrayed in a first direction and have widths taken in a second direction perpendicular to the first direction. In the operation for changing the active energy-selecting slit through which the electron beam passes, the slit position controller may move the slit plate in the first direction. In the operation for adjusting the position of the active energy-selecting slit taken in the direction of dispersion, the slit position controller may move the slit plate in the second direction.

In this electron microscope, the moving mechanism permits both change of the active energy-selecting slit through which the electron beam passes and adjustment of the position of the active energy-selecting slit taken in the direction of dispersion.

(6) In another feature of the electron microscope set forth in the paragraph (3) above, the slit position controller may operate to control the position of the electron beam relative to the active energy-selecting slit taken in the direction of dispersion by controlling the energy filter on the basis of results of measurements made by the second measuring section.

In this electron microscope, adjustment of the position of the active energy-selecting slit taken in the direction of dispersion can be automated. Accordingly, in this electron microscope, an observation or analysis at an optimized electron beam brightness (e.g., at a high brightness) can be performed easily. Furthermore, in this electron microscope, the position of the electron beam relative to the active energy-selecting slit taken in the direction of dispersion is adjusted by deflecting the electron beam. Consequently, the position can be adjusted more smoothly than where the slit plate is mechanically moved for adjusting purposes.

(7) A method associated with the present invention is used to adjust a monochromator included in an electron microscope, the monochromater having an energy filter and a slit plate. The energy filter disperses an electron beam emitted from an electron beam source according to energy. The slit plate is disposed on an energy dispersive plane and provided with plural energy-selecting slits that are different in width taken in a direction where the electron beam is dispersed. The method starts with measuring the intensity of the electron beam emitted from the electron beam source. The intensity of the beam passed through an active one of the energy-selecting slits is measured. The active energy-selecting slit through which the electron beam has passed is identified from among the plural energy-selecting slits on the basis of both the measured intensity of the beam emitted from the electron beam source and the measured intensity of the beam that has passed through the active energy-selecting slit.

In this method of adjusting a monochromator, the active energy-selecting slit through which the electron beam has passed can be identified on the basis of both the intensity of the electron beam emitted from the electron beam source and the intensity of the electron beam which has passed through the active energy-selecting slit. Therefore, this method of adjustment of monochromator dispenses with a conventional procedure, for example, consisting of counting the number of actions for switching the slit width on operator's fingers and identifying what slit width is installed in the beam path. Consequently, this method facilitates adjusting the monochromator.

(8) In one feature of this method of adjusting a monochromator, during the step of identifying the active energy-selecting slit, this energy-selecting slit may be identified by finding the width, WL, of this slit using the following Eq. (1):

$$IL = \alpha \cdot WL \cdot It \qquad (1)$$

where IL is the intensity of the electron beam which has passed through the active energy-selecting slit, It is the intensity of the electron beam emitted from the electron beam source, and $\alpha$ is a proportional constant.

In this method of adjusting a monochromator, the active energy-selecting slit through which the electron beam has passed can be easily identified.

(9) In another feature of this method of adjusting a monochromator, there may be further provided the steps of: making a decision as to whether the active energy-selecting slit identified by the step of identifying the active energy-selecting slit is coincident with a desired one of the plural energy-selecting slits; and moving the position of the slit plate on the basis of the result of the decision to change the active energy-selecting slit through which the electron beam passes.

In this method of adjusting a monochromator, an energy-selecting slit of a desired slit width can be placed in the path of the electron beam.

(10) In a further feature of this method of adjusting a monochromator, there may be further provided the step of: moving the position of the slit plate on the basis of the intensity of the electron beam which has passed through the active energy-selecting slit to adjust the position of the active energy-selecting slit through which the electron beam has passed, the position being taken in the direction of dispersion.

In this method of adjusting a monochromator, an observation or analysis can be performed at an optimized electron beam brightness (at a high brightness).

(11) In one feature of this method of adjusting a monochromator, the plural energy-selecting slits are arrayed in a first direction and have widths taken in a second direction perpendicular to the first direction. During the step of changing the active energy-selecting slit through which the electron beam passes, the slit plate may be moved in the first direction. During the step of adjusting the position of the active energy-selecting slit taken in the direction of dispersion, the slit plate may be moved in the second direction.

In this method of adjusting a monochromator, both a change of the active energy-selecting slit through which the electron beam passes and an adjustment of the position of the active energy-selecting slit taken in the direction of dispersion can be carried out by moving the slit plate.

(12) In a further feature of this method of adjusting a monochromator, there may be further provided the step of controlling the energy filter on the basis of the intensity of the electron beam which has passed through the active energy-selecting slit, thus adjusting the position of the electron beam relative to the active energy-selecting slit taken in the direction of dispersion.

In this method of adjusting a monochromator, a positional adjustment can be made more smoothly, for example, than where the slit plate is moved mechanically.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment
1.1. Electron Microscope

Figure 1:
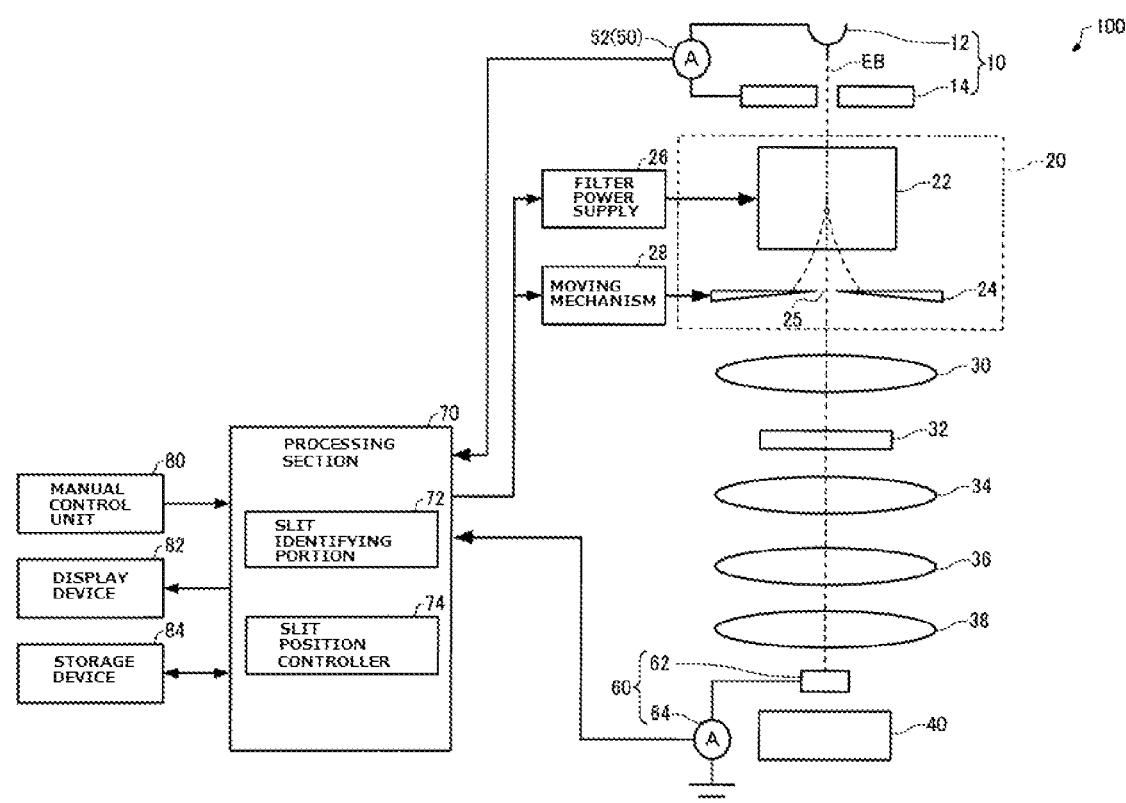
FIG. 1 is a schematic representation, partly in block form, of an electron microscope associated with a first embodiment of the present invention.

An electron microscope associated with a first embodiment of the present invention is first described by referring to FIG. 1, which schematically shows the configuration of the electron microscope, 100.

The electron microscope 100 is a transmission electron microscope (TEM) that is an instrument for imaging electrons transmitted through a sample to obtain transmission electron microscope (TEM) images including bright field images, dark field images, diffraction patterns, and so on.

As shown in FIG. 1, the electron microscope 100 includes an electron beam source 10, a monochromator 20, a filter power supply 26, a moving mechanism 28, a condenser lens system 30, a sample stage 32 for holding a sample, an objective lens 34, an intermediate lens 36, a projector lens 38, an imager 40, a first measuring section 50, a second measuring section 60, a processing section 70, a manual control unit 80, a display device 82, and a storage device 84.

The electron beam source 10 produces an electron beam EB. For example, a field-emission electron gun can be used as the electron beam source 10. The electron beam source 10 has an electron source (emitter, or a cathode) 12 and an electron gun electrode 14 (an extractor electrode, or an anode). In the electron beam source 10, an extractor voltage is applied to the electron gun electrode 14 to produce electrons of a given current from the electron source 12. An accelerating voltage is applied to an acceleration electrode (not shown) to obtain an electron beam having a given energy. A thermionic-emission electron gun or a Schottky electron gun may be used as the electron beam source 10.

The monochromator 20 monochromatizes the electron beam EB, i.e., selects a given energy width of the electron beam EB. The monochromator 20 has an energy filter 22 and a slit plate 24 provided with energy-selecting slits 25.

The energy filter 22 disperses the incident electron beam EB according to energy. The energy filter 22 produces a deflecting field that is a magnetic field, an electric field, or both magnetic and electric fields in the path of the electron beam EB, spectrally disperses the electron beam EB by making use of difference in orbit depending on the speed of electrons within the deflecting field, and projects a spectrum onto an energy dispersive plane. In the energy filter 22, the position of the electron beam EB on the energy dispersive plane taken in the direction of dispersion can be moved by controlling the deflecting field.

The energy filter 22 is made, for example, of a Wien filter that applies an electric field and a magnetic field, which are perpendicular to each other, to the electron beam EB traveling along the optical axis. No restriction is placed on the type of the energy filter 22 as long as the electron beam can be dispersed according to energy. For example, an omega filter can be used as the energy filter 22. Electric power for operation is supplied to the energy filter 22 from the filter power supply 26.

The slit plate 24 is disposed on the energy dispersive plane and provided with the energy-selecting slits 25. A desired energy width of the electron beam can be extracted using the energy-selecting slits 25.

Figure 2:
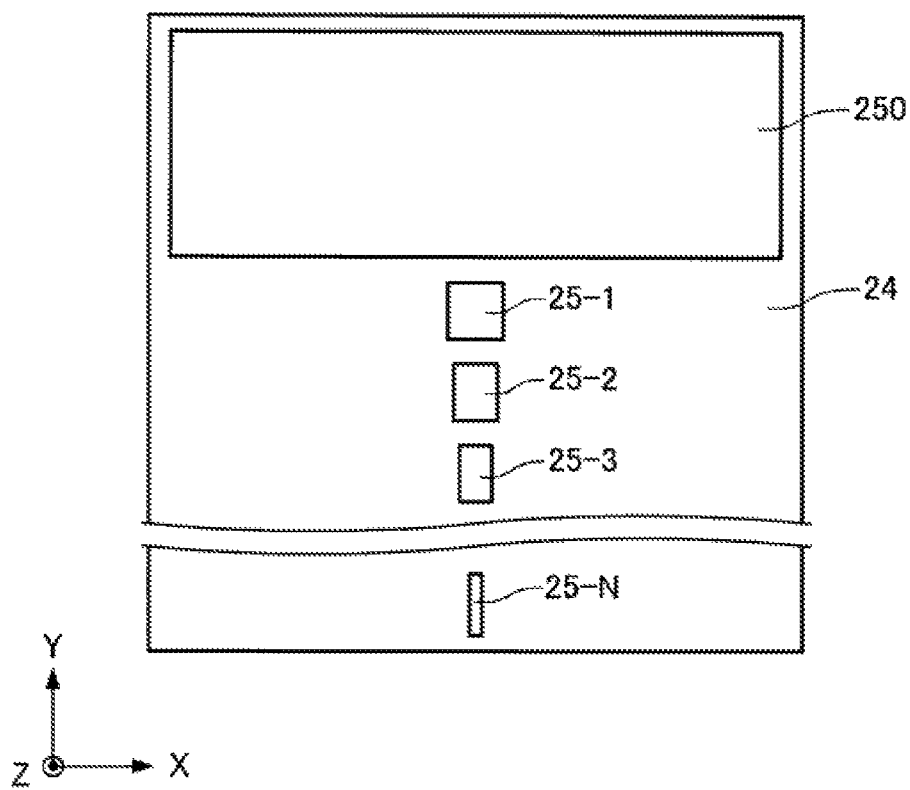
FIG. 2 is a schematic plan view of the slit plate of the electron microscope shown in FIG. 1.

FIG. 2 is a schematic plan view of the slit plate 24. In FIG. 2, X-, Y-, and Z-axes are shown as mutually perpendicular axes.

For example, the slit plate 24 is made of a metal plate. As shown in FIG. 2, the plural energy-selecting slits 25 are formed in the slit plate 24. The energy-selecting slits 25 are different in width taken in the direction where the electron beam is dispersed (X-axis direction). This width is termed the slit width. These energy-selecting slits 25 are energy-selecting slits 25-1, 25-2, 25-3, ..., 25-N (where N is an integer equal to or greater than 2) which are arrayed along the Y-axis in order of decreasing slit width. For example, each energy-selecting slit 25 is rectangular in planar shape, for example. The slit width of each energy-selecting slit 25 is hundreds of nanometers to tens of microns. Furthermore, the slit plate 24 has an open hole 250 to permit the whole incident electron beam EB to pass through.

The slit plate 24 can be moved in the directions of the X- and Y-axes via the moving mechanism 28. The energy-selecting slit 25 (hereinafter may be referred to as the active energy-selecting slit 25-L) through which the electron beam EB passes can be altered by moving the slit plate 24 in the Y-axis direction. The active energy-selecting slit 25-L is placed in the path of the electron beam EB. An adjustment can be made to bring the intensity center of the spectrum of the electron beam EB into coincidence with the widthwise center of the active energy-selecting slit 25-L taken in the X-axis direction, for example, by moving the slit plate 24 in the X-axis direction.

The moving mechanism 28 is used to move the slit plate 24. The moving mechanism 28 can move the slit plate 24 in both directions of the X- and Y-axes. The moving mechanism 28 is configured, for example, including an electric motor that operates to move the slit plate 24 in the direction of the X- or Y-axis.

The condenser lens system 30 focuses the electron beam EB, which has been monochromatized by the monochromator 20, onto the sample held on the sample stage 32. The condenser lens system 30 is made up of a plurality of condenser lenses. In the electron microscope 100, the condenser lens system 30 constitutes an illumination lens system for illuminating the sample with the electron beam EB.

The objective lens 34 is an initial stage of lens for imaging the electron beam EB transmitted through the sample. The objective lens 34 has an upper polepiece and a lower polepiece (none of which are shown). The objective lens 34 produces a magnetic field between the upper and lower polepieces to focus the electron beam EB.

The intermediate lens 36 is located behind the objective lens 34. The projector lens 38 is positioned behind the intermediate lens 36. The intermediate lens 36 and projector lens 38 cooperate to further magnify the image focused by the objective lens 34 and to focus the image onto the imager 40. In the electron microscope 100, an imaging lens system is constituted by the objective lens 34, intermediate lens 36, and projector lens 38.

The imager 40 captures a TEM image focused by the imaging lens system including the lenses 34, 36, and 38. The imager 40 is a digital camera such as a CCD camera.

The first measuring section 50 measures the intensity (amount of current) of the electron beam EB emitted from the electron beam source 10. The first measuring section 50 is configured, for example, including an ammeter 52 connected between the electron source (emitter or cathode) 12 of the electron beam source 10 and the electron gun electrode (anode). The amount of current of the electron beam emitted from the electron beam source 10 can be measured by the first measuring section 50. The first measuring section 50 outputs information about the result of the measurement indicative of the amount of current of the electron beam EB to the processing section 70.

The second measuring section 60 measures the intensity (amount of current) of the electron beam EB that has passed through the active energy-selecting slit 25-L. The second measuring section 60 is configured including a Faraday cup 62 and an ammeter 64 connected with the Faraday cup 62.

The Faraday cup 62 is located behind (i.e., on the downstream side relative to the direction of travel of the electron beam EB) the projector lens 38. No restriction is imposed on the place where the Faraday cup 62 is disposed as long as the cup is located behind the monochromator 20. When the electron beam EB is detected, the Faraday cup 62 is placed in the path of the electron beam EB. When the beam EB is not detected, e.g., when a TEM image is taken, the cup 62 is located off the path of the beam EB.

When the electron beam EB is detected using the Faraday cup 62, the focal distance of the lens system of the electron. microscope 100 including the lenses 30, 34, 36, and 38 and the angle of deflection of deflection coils (not shown) for detecting the electron beam EB are so adjusted that the electron beam EB passed through the active energy-selecting slit 25-L is not cut off during the period beginning with passage through the slit 25-L and ending with detection by the Faraday cup 62. Data about the focal distance of the lens system (30, 34, 36, and 38) and data about the angle of deflection of the deflection coils which are used when the electron beam EB is detected using the Faraday cup 62 are previously stored in the storage device 84 and used for detection of current.

The ammeter 64 is incorporated between the Faraday cup 62 and a point at ground potential. The amount of current of the electron beam EB detected by the Faraday cup 62 can be measured by the ammeter 64. Therefore, in the second measuring section 60, the amount of current of the electron beam EB that has passed through the active energy-selecting slit 25-L can be measured. The second measuring section 60 outputs information about the result of the measurement which indicates the amount of current of the beam EB to the processing section 70.

The manual control unit 80 permits a human operator to enter manual control information, and outputs the entered manual control information to the processing section 70. For example, the manual control unit 80 is made of buttons, keys, a touch panel display, a microphone, or the like.

The display device 82 provides a display of the image generated by the processing section 70. The function of the display device 82 can be implemented by an LCD, CRT, or the like. The display device 82 outputs information, for example, for identifying the active energy-selecting slit 25-L through which the electron beam has passed.

The storage device 84 acts as a working area for the processing section 70. The function of the storage device 84 can be implemented by a RAM or the like. The storage device 84 stores programs, data, and other related information permitting the processing section 70 to perform various kinds of computational processing and control operations. The storage device 84 is also used to temporarily store the results of computations executed by the processing section 70 in accordance with various programs.

The processing section 70 performs various kinds of computational processing and control operations in accordance with computer programs stored in the storage device 84. The processing section 70 operates as a slit identifying portion 72 and a slit position controller 74 which will be described later by executing computer programs stored in the storage device 84. The functions of the processing section 70 can be implemented by hardware such as various processors (e.g., a CPU or a DSP) or an ASIC (such as a gate array) or by computer programs. At least a part of the processing section 70 may be realized by hardware (dedicated circuitry).

The slit identifying portion 72 identifies which one of the energy-selecting slits 25-1 to 25-N is the active energy-selecting slit 25-L (where L=1, 2, 3, . . . , N) through which the electron beam EB has passed on the basis of the results of measurements made by the first measuring section 50 and the results of measurements made by the second measuring section 60. That is, the slit identifying portion 72 operates to identify the active energy-selecting slit 25-L currently located in the path of the electron beam EB.

In particular, the slit identifying portion 72 finds the slit width WL of the active energy-selecting slit 25-L through which the electron beam EB has passed, using a formula expressing the relation between the intensity IL of the beam EB which has passed through the active energy-selecting slit 25-L and the intensity It of the electron beam EB emitted from the electron beam source 10 from the results of measurements made by the first and second measuring sections 50 and 60, and identifies the active energy-selecting slit 25-L through which the beam EB has passed.

A formula expressing the relation between the intensity IL of the electron beam EB that has passed through the active energy-selecting slit 25-L and the intensity It of the beam EB emitted from the electron beam source 10 is now described. The intensity of the electron beam EB is here represented as the amount of current of the beam EB. As described later, the intensity of the electron beam EB can also be represented as the count (PMT count) of a photomultiplier tube (PMT) that detects the electron beam EB.

There is a roughly proportional relation between the intensity It of the electron beam EB emitted from the electron beam source 10 and the intensity Ia of the electron beam EB on the axis of the lens system used in the electron microscope 100. Furthermore, there is a proportional relation between the intensity Ia of the electron beam EB on the axis of the lens system and the intensity (amount of current) IL of the beam passing through the active energy-selecting slit 25-L. Therefore, the intensity IL of the electron beam EB that has passed through the active energy-selecting slit 25-L and the intensity It of the electron beam EB emitted from the electron beam source 10 are given by the following Eq. (1):

$$IL = \alpha \cdot WL \cdot It \tag{1}$$

where $\alpha$ is a proportional constant.

The intensity (amount of current) It of the electron beam EB emitted from the electron beam source 10 corresponds to the result of the measurement of the first measuring section 50. Furthermore, the intensity IL of the electron beam passing through the active energy-selecting slit 25-L corresponds to the result of the measurement made by the second measuring section 60. The proportional constant $\alpha$ can be found by making measurements using known ones of the energy-selecting slits 25.

Therefore, the slit identifying portion 72 can find the slit width WL of the active energy-selecting slit 25-L through which the electron beam EB has passed using Eq. (1) above from the results of the measurements made by the first and second measuring sections 50, 60.

The slit identifying portion 72 identifies the active energy-selecting slit 25-L, for example, by collating the found slit width WL against a database of the slit widths W1-WN of the energy-selecting slits 25-1 to 25-N, respectively. The proportional constant $\alpha$ and the database may be previously stored in the storage device 84.

The slit position controller 74 controls the moving mechanism 28. The slit position controller 74 performs an operation for making a decision as to whether the energy-selecting slit 25-L identified by the slit identifying portion 72 is a desired energy-selecting slit 25-M and an operation for controlling the moving mechanism 28 on the basis of the result of the decision to move the position of the slit plate 24 for altering the active energy-selecting slit 25-L through which the electron beam EB passes.

Furthermore, the slit position controller 74 operates to control the energy filter 22 on the basis of the result of the measurement made by the second measuring section 60 for adjusting the position of the electron beam EB relative to the active energy-selecting slit 25-L taken in the direction where the beam EB is dispersed (X-axis direction). More specifically, the slit position controller 74 controls the energy filter 22, for example, to maximize the amount of current of the electron beam EB measured by the second measuring section 60. Because of this operation, the intensity center of the spectrum created by the electron beam EB can be brought into coincidence with the widthwise center of the active energy-selecting slit 25-L taken in the X-axis direction.

1.2. Method of Adjusting Monochromator

Figure 3:
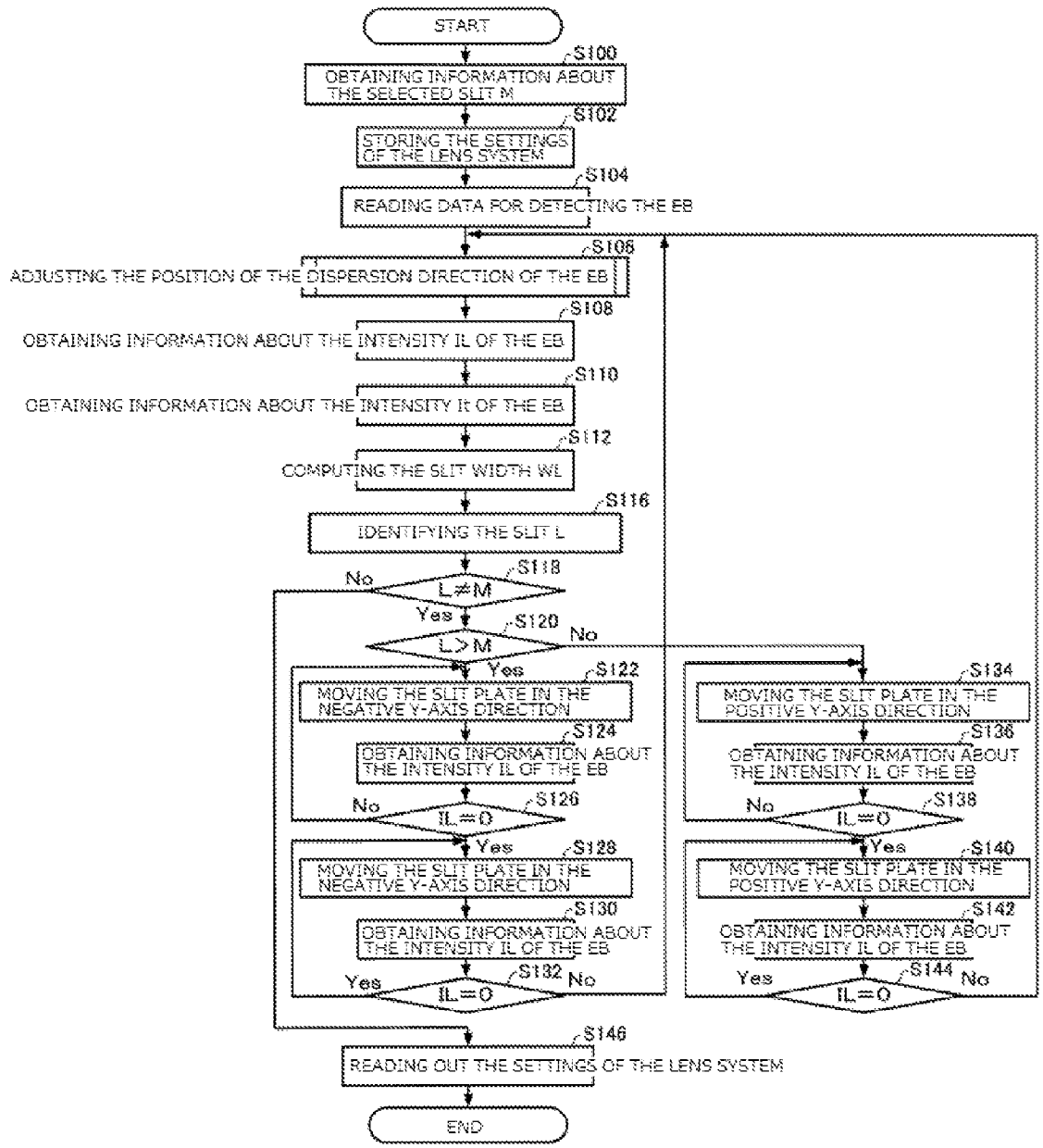
FIG. 3 is a flowchart illustrating one example of method of adjusting the monochromator in the electron microscope shown in FIG. 1.

A method of adjusting the monochromator 20 in the electron microscope 100 associated with the first embodiment is next described by referring to FIG. 3. An operation for placing the desired energy-selecting slit 25-M (M=1, 2, 3, . . . , N) of the electron microscope 100 selected by the operator into the beam path of the electron beam EB is described. In the following, it is assumed that it is not known as to which one of the N energy-selecting slits 25-1 to 25-N is the active energy-selecting slit 25-L currently placed in the beam path of the beam EB.

FIG. 3 is a flowchart illustrating one example of method of adjusting the monochromator 20 in the electron microscope 100 associated with the first embodiment.

First, the processing section 70 obtains information about the desired energy-selecting slit 25-M selected by the operator (step S100). In particular, if information about the desired energy-selecting slit 25-M is entered by the operator via the manual control unit 80, the processing section 70 obtains the information about this desired slit 25-M and stores the information in the storage device 84.

Then, the current settings of the lens system including the lenses 30, 34, 36, 38 of the electron microscope 100 and the current settings of a deflecting system (not shown) for deflecting the electron beam are stored in the storage device 84 by the processing section 70 (step S102). For example, the processing section 70 stores information about the current focal distance of the lens system including the lenses 30, 34, 36, 38 of the electron microscope 100 and information about the angle of deflection of the deflection coils for deflecting the beam EB into the storage device 84.

Then, the processing section 70 reads data about the focal distance of the lens system (30, 34, 36, 38) for detecting the electron beam EB using the Faraday cup 62 and data about the angle of deflection of the deflection coils (not shown) for deflecting the beam EB from the storage device 84 (step S104). The processing section 70 then sets the focal distance of the lens system (30, 34, 36, 38) and the angle of deflection of the deflection coils on the basis of the data.

The slit position controller 74 controls the energy filter 22 on the basis of the result of the measurement made by the second measuring section 60 to adjust the position of the electron beam EB relative to the active energy-selecting slit 25-L taken in the direction where the electron beam EB is dispersed (step S106). As a result, the intensity center of the spectrum of the dispersed electron beam EB can be brought into coincidence with the widthwise center of the active energy-selecting slit 25-L taken in the X-axis direction. The present step S106 will be described in further detail later.

Then, the slit identifying portion 72 obtains information about the intensity (amount of current) IL of the electron beam EB which has passed through the active energy-selecting slit 25-L, the intensity being measured by the second measuring section 60 (step S108).

The slit identifying portion 72 then obtains information about the intensity It of the electron beam emitted from the electron beam source 10, the intensity It being measured by the first measuring section 50 (step S110). Then (i.e., after step S110), information about the intensity IL of the electron beam EB that has passed through the active energy-selecting slit 25-L may be obtained (step S108).

The slit identifying portion 72 then computes the slit width WL of the active energy-selecting slit 25-L using Eq. (1) on the basis of the result of the measurement (amount of current It) made by the first measuring section 50 and the result of the measurement (amount of current IL) made by the second measuring section 60 (step S112).

The slit identifying portion 72 then identifies the active energy-selecting slit 25-L from the found slit width WL of the energy-selecting slit 25-L (step S116). The slit identifying portion 72 identifies the active energy-selecting slit 25-L, for example, by collating the found slit width WL against the database of the slit widths W1-WN of the energy-selecting slits 25-1 to 25-N, respectively, previously stored in the storage device 84.

The slit position controller 74 then makes a decision as to whether the active energy-selecting slit 25-L identified by the slit identifying portion 72 disagrees with the desired energy-selecting slit 25-M (step S118).

If the decision at step S118 is affirmative (Yes), indicating that the identified energy-selecting slit 25-L disagrees with the desired energy-selecting slit 25-M, the slit position controller 74 makes a decision as to whether the relation, L>M, is satisfied (step S120).

As shown in FIG. 2, the energy-selecting slits 25-1 to 25-N have successively decreasing slit widths. Accordingly, making a decision as to whether the relation, L>M, is satisfied is, in other words, to make a decision as to whether the slit width WL of the active energy-selecting slit 25-L is smaller than the slit width WM of the desired energy-selecting slit 25-M (WL<WM).

If the decision at step S120 is Yes, indicating that the slit width WL of the active energy-selecting slit 25-L is smaller than the slit width WM of the desired energy-selecting slit 25-M (L>M), the slit position controller 74 operates to vary the active energy-selecting slit from the slit 25-L to the energy-selecting slit 25-(L−1) adjacent to the slit 25-L in the positive Y-axis direction (steps S122-S132).

On the other hand, if the decision at step S120 is negative (No), indicating that the relation, L>M, is not satisfied, i.e., the slit width WL of the active energy-selecting slit 25-L is greater than the slit width WM of the desired energy-selecting slit 25-M, the slit position controller 74 operates to vary the active energy-selecting slit from the slit 25-L to the slit 25-(L+1) adjacent to the slit 25-L in the negative Y-axis direction (steps S134-S144).

The operation (steps S122-S132 and steps S134-S144) for varying the active energy-selecting slit 25-L is described below.

If the decision at step S120 is Yes, indicating that the relation, L>M, is satisfied, the slit position controller 74 controls the moving mechanism 28 to move the slit plate 24 by an incremental distance of ΔY in the negative Y-axis direction (step S122). For instance, the distance ΔY is greater than the diameter of the electron beam EB and smaller than the distance between adjacent ones of the energy-selecting slits 25.

The slit position controller 74 then obtains information about the amount of current IL of the electron beam EB that has passed through the active energy-selecting slit 25-L, the amount of current IL being measured by the second measuring section 60 after the incremental movement of the step plate 24 at step S122 (step S124).

The slit position controller 74 then makes a decision as to whether the amount of current IL obtained at step S124 satisfies a relation, IL=0, (step S126). The relation, IL=0, indicates a state in which the path of the electron beam EB is located between the adjacent energy-selecting slits 25-L and 25-(L−1) and in which the beam EB is cut off by the slit plate 24.

If the decision at step S126 is No, indicating that the relation, IL=0, is not satisfied, the slit position controller 74 again moves the slit plate 24 by the incremental distance ΔY in the negative Y-axis direction (step S122) and obtains information about the amount of current IL of the electron beam EB after the slit plate 24 has been moved incrementally (step S124). The slit position controller 74 repeats the processing sequence of the steps S122, S124, and S126 until the relation, IL=0, is satisfied.

If the decision at step S126 is Yes, indicating that the relation, IL=0, is satisfied, the slit position controller 74 controls the moving mechanism 28 to move the slit plate 24 by the incremental distance ΔY in the negative Y-axis direction (step S128).

Then, the slit position controller 74 obtains information about the amount of current IL of the electron beam EB, the amount of current IL being measured by the second measuring section 60 after the slit plate 24 is moved incrementally at step S128 (step S130).

The slit position controller 74 then makes a decision as to whether the amount of current IL obtained at step S128 satisfies the relation, IL=0, (step S132).

If the decision at step S132 is Yes, indicating that the relation, IL=0, is satisfied, the slit position controller 74 again moves the slit plate 24 by the incremental distance ΔY in the negative Y-axis direction (step S128) and then obtains information about the amount of Current IL of the electron beam EB under this condition (step S130). The slit position controller 74 repeats the processing sequence of the steps S128, S130, and S132 until the relation, IL=0, is no longer satisfied, i.e., the path of the electron beam EB is placed at the next energy-selecting slit 25-(L−1).

If the decision at step S132 is No, indicating that the relation, IL=0, is satisfied, i.e., the electron beam EB has passed through the energy-selecting slit 25-(L−1), the slit position controller 74 controls the energy filter 22 on the basis of the result of the measurement made by the second measuring section 60 to adjust the position of the beam EB relative to the energy-selecting slit 25-L (L=L−1) taken in the position of the dispersion (step S106). Consequently, the intensity center of the spectrum of the dispersed electron beam EB can be brought into coincidence with the widthwise center of the active energy-selecting slit 25-L taken in the X-axis direction.

On the other hand, if the decision at step S120 is No, indicating that the relation, L>M, is not satisfied, the slit position controller 74 controls the moving mechanism 28 to move the slit plate 24 by the incremental distance ΔY in the positive Y-axis direction (step S134).

The slit position controller 74 then obtains information about the amount of current IL of the electron beam EB measured by the second measuring section 60 after the slit plate 24 is moved incrementally at step S134 (step S136).

The Slit position controller 74 then makes a decision as to whether the amount of current IL obtained at step S136 satisfies the relation, IL=0, (step S138). The relation, IL=0, indicates a state in which the path of the electron beam EB is located between the adjacent energy-selecting slits 25-L and 25-(L+1) and thus cut off by the slit plate 24.

If the decision at step S138 is No, indicating that the relation, IL=0, is not satisfied, the slit position controller 74 again moves the slit plate 24 by the incremental distance ΔY in the positive Y-axis direction (step S134) and obtains information about the amount of current IL of the electron beam EB under this condition (step S136). The slit position controller 74 repeats the processing sequence of the steps S134, S136, and S138 until the relation, IL=0, is satisfied.

If the decision at step S138 is Yes, indicating that the relation, IL=0, is satisfied, the slit position controller 74 controls the moving mechanism 28 to move the slit plate 24 by the incremental distance ΔY in the positive Y-axis direction (step S140).

The slit position controller 74 then obtains information about the amount of current IL of the electron beam EB measured by the second measuring section 60 after the slit plate 24 is moved incrementally at step S140 (step S142).

The slit position controller 74 then makes a decision as to whether the amount of current IL obtained at step S142 satisfies the relation, IL=0 (step S144).

If the decision at step S144 is Yes, indicating that the relation, IL=0, is satisfied, the slit position controller 74 again moves the slit plate 24 by the incremental distance ΔY in the positive Y-axis direction (step S140) and obtains information about the amount of current IL of the electron beam EB under this condition (step S142). The slit position controller 74 repeats the processing sequence of the steps S140, S142, and S144 until the relation, IL=0, is no longer satisfied, i.e., the path of the electron beam EB is placed at the next energy-selecting slit 25-(L+1).

If the decision at step S144 is No, indicating that relation, IL=0, is not satisfied, i.e., the electron beam EB has passed through the energy-selecting slit 25-(L+1), the slit position controller 74 controls the energy filter 22 on the basis of the measurement made by the second measuring section 60 to adjust the position of the electron beam EB relative to the active energy-selecting slit 25-L (L=L+1), taken in the direction where the beam EB is dispersed (step S106). Consequently, the intensity center of the spectrum of the dispersed electron beam EB can be brought into coincidence with the widthwise center of the active energy-selecting slit 25-L taken in the X-axis direction. Because of the processing sequence of the steps S122-S132 and steps S134-S144, the active energy-selecting slit 25-L can be changed.

The processing section 70 repeats the processing sequence of the steps S106-S144 until the decision at step S118 becomes negative (No), indicating that the active energy-selecting slit 25-L agrees with the desired energy-selecting slit 25-M.

If the decision at step S118 is No, indicating that the active energy-selecting slit 25-L agrees with the desired energy-selecting slit 25-M, i.e., the desired energy-selecting slit 25-M is placed in the path of the electron beam EB, then the processing section 70 reads out the settings of the lens system of the electron microscope 100 including the lenses 30, 34, 36, and 38 and the settings of the deflection coils for deflecting the electron beam EB (step S146). The settings were stored in the storage device 84 at step S102. The processing section 70 sets the focal distance of the lens system including the lenses 30, 34, 36, 38 and the angle of deflection achieved by the deflection coils on the basis of the information about the settings. Consequently, the lens system of the electron microscope 100 including the lenses 30, 34, 36, 38 and the deflection coils can be returned to their states assumed prior to adjustment of the monochromator 20. The processing section 70 ends the present processing subroutine. Because of the processing sequence described so far, the operator can place the selected energy-selecting slit 25-M in the path of the electron beam EB.

Figure 4:
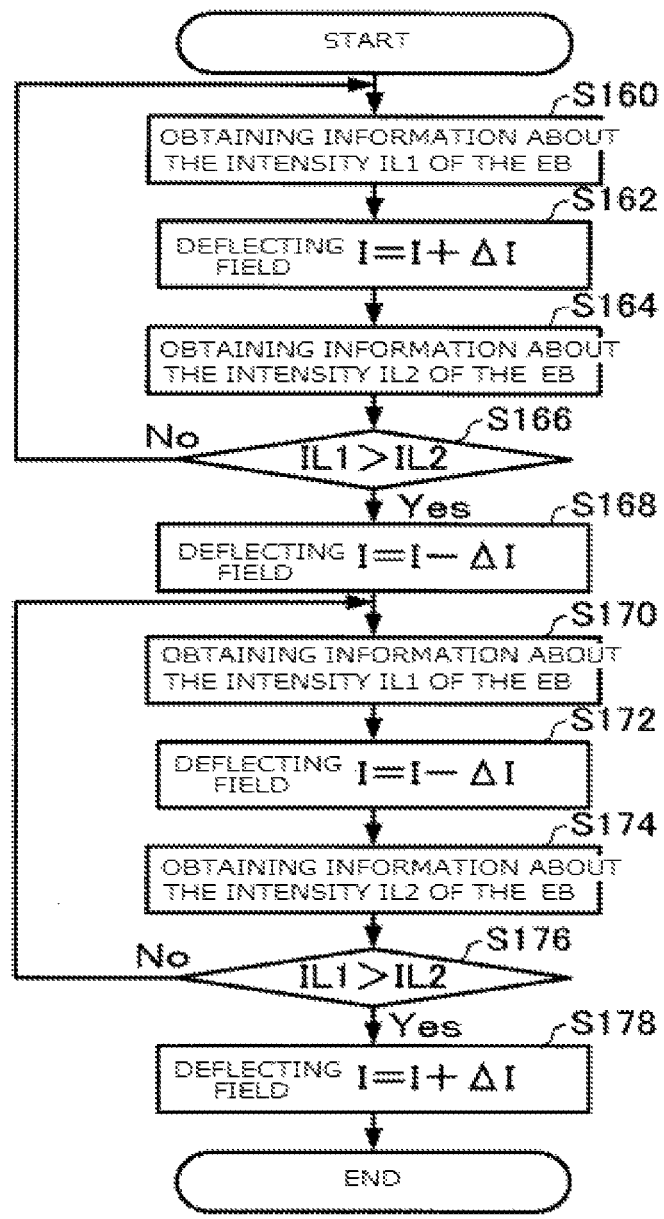
FIG. 4 is a flowchart illustrating one example of method of adjusting the position of an electron beam relative to an active energy-selecting slit in the electron microscope shown in FIG. 1, the position being taken in the direction where the beam is dispersed.

The step S106 of controlling the energy filter 22 on the basis of the measurement made by the second measuring section 60 to adjust the position of the electron beam EB relative to the active energy-selecting slit 25-L taken in the direction where the beam EB is dispersed is next described by referring to the flowchart of FIG. 4, which illustrates one example of the method of adjusting the position of the beam EB relative to the active energy-selecting slit 25-L taken in the direction where the beam EB is dispersed.

First, the slit position controller 74 obtains information about the amount of current IL1 of the electron beam EB that has passed through the active energy-selecting slit 25-L, the amount of current being measured by the second measuring section 60 (step S160).

Then, the slit position controller 74 increases the output I of the filter power supply 26 by an incremental amount ΔI, the power supply 26 being operative to control the deflecting field in the energy filter 22, to move the position of the electron beam EB on the slit plate 24 by an incremental distance ΔX in the positive X-axis direction (step S162).

Then, the slit position controller 74 obtains information about the amount of current IL2 of the electron beam EB that has passed through the active energy-selecting slit 25-L, the amount of current being measured by the second measuring section 60 after the incremental movement of the position of the beam EB at step S162 (step S164).

The slit position controller 74 then makes a decision as to whether the amount of current IL1 is greater than the amount of current IL2 (i.e., IL1>IL2) (step S166).

If the decision at step S166 is No, indicating that the relation, IL1>IL2, is not satisfied, the slit position controller 74 again performs the steps S160, S162, S164, and S166. The slit position controller 74 repeats the processing sequence of the steps S160, S162, S164, and S166 until the relation, IL1>IL2, is satisfied.

If the decision at step S166 is Yes, indicating that the relation, IL1>IL2, is satisfied, then the slit position controller 74 reduces the output I of the filter power supply 26 by the incremental amount ΔI to move the position of the electron beam EB on the slit plate 24 by the incremental distance ΔX in the negative X-axis direction (step S168).

The slit position controller 74 then obtains information about the amount of current IL1 of the electron beam EB that has passed through the active energy-selecting slit 25-L, the amount of current being measured by the second measuring section 60 after the incremental movement of the position of the beam EB at step S168 (step S170).

The slit position controller 74 then reduces the output I of the filter power supply 26 by the incremental amount ΔI to move the position of the electron beam EB on the slit plate 24 by the incremental distance ΔX in the negative X-axis direction (step S172).

The slit position controller 74 then obtains information about the amount of current IL2 of the electron beam EB that has passed through the active energy-selecting slit 25-L, the amount of current being measured by the second measuring section 60 after the incremental movement of the position of the beam EB at step S172 (step S174).

The slit position controller 74 then makes a decision as to whether the amount of current IL1 is greater than the amount of current IL2 (i.e., IL1>IL2) (step S176).

If the decision at step S176 is No, indicating that the relation, IL1>IL2, is not satisfied, the slit position controller 74 again performs the steps S170, S172, S174, and S176. The slit position controller 74 repeats the processing sequence of the steps S170, S172, S174, and S176 until the relation, IL1>IL2, is satisfied.

If the decision at step S176 is Yes, indicating that the relation, IL1>IL2, is satisfied, the slit position controller 74 increases the output I of the filter power supply 26 by the incremental amount ΔI to move the position of the electron beam EB on the slit plate 24 by the incremental distance ΔX in the positive X-axis direction (step S178). Because of the processing described so far, the intensity center of the spectrum of the dispersed electron beam EB can be brought into coincidence with the widthwise center of the active energy-selecting slit 25-L taken in the X-axis direction by adjusting the position of the beam EB relative to the active energy-selecting slit 25-L taken in the direction of dispersion.

The electron microscope 100 has the following features. The microscope 100 has the first measuring section 50 for measuring the amount of current of the electron beam EB emitted from the electron beam source 10, the second measuring section 60 for measuring the amount of current of the beam EB that has passed through the active energy-selecting slit 25-L, and the slit identifying portion 72 for identifying the active energy-selecting slit 25-L through which the beam EB has passed from among the plural energy-selecting slits 25-1 to 25-N on the basis of the results of the measurements made by the first and second measuring sections 50, 60. Therefore, in the electron microscope 100, the active energy-selecting slit 25-L through which the electron beam EB has passed can be identified. That is, in the electron microscope 100, the operation for identifying the active energy-selecting slit 25-L from among the plural energy-selecting slits 25-1 to 25-N can be automated. Consequently, the electron microscope 100 dispenses with a conventional procedure, for example, consisting of counting the number of actions for switching the slit width on operator's fingers and identifying what slit width is installed in the beam path. As a result, in this electron microscope 100, operations can be simplified and the monochromator 20 can be adjusted easily.

In the electron microscope 100, the slit identifying portion 72 finds the width WL of the active energy-selecting slit 25-L using Eq. (1) and identifies the active energy-selecting slit 25-L through which the electron beam EB has passed. Therefore, in the microscope 100, the active energy-selecting slit 25-L can be identified easily.

In the electron microscope 100, the slit position controller 74 performs the operation (step S118) for making a decision as to whether the active energy-selecting slit 25-L identified by the slit identifying portion 72 disagrees with the desired energy-selecting slit 25-M and the operation for controlling the moving mechanism 28 on the basis of the result of the decision to move the position of the slit plate 24, for varying the active energy-selecting slit 25-L through which the electron beam EB passes. Consequently, in the electron microscope 100, the energy-selecting slit 25-M having a desired slit width can be placed in the beam path of the electron beam EB by the slit position controller 74. That is, in the microscope 100, the operation for placing the energy-selecting slit 25-M having the desired slit width into the path of the electron beam EB can be automated. Hence, in the microscope 100, operations can be simplified and the monochromator 20 can be adjusted easily.

In the electron microscope 100, the slit position controller 74 controls the energy filter 22 on the basis of the result of the measurement made by the second measuring section 60 to adjust the position of the electron beam EB relative to the active energy-selecting slit 25-L taken in the direction where the beam EB is dispersed. Therefore, in the microscope 100, adjustment of the position of the active energy-selecting slit 25-L can be automated. Thus, in the microscope 100, an observation or analysis can be performed easily at an optimized electron beam brightness (or, at high brightness). Furthermore, in the microscope 100, the position of the electron beam EB relative to the active energy-selecting slit 25-L taken in the direction of dispersion is adjusted by deflecting the beam EB and so the position can be adjusted more smoothly as compared to the case where the slit plate 24 is mechanically moved for the same purpose.

The method of adjusting the monochromator 20 in the electron microscope 100 comprises the steps of: measuring the intensity (amount of current) It of the electron beam EB emitted from the electron beam source 10 (step S110), measuring the intensity (amount of current) IL of the electron beam EB that has passed through the active energy-selecting slit 25-L (step S108), and identifying the active energy-selecting slit 25-L through which the electron beam EB has passed from among the plural energy-selecting slits 25-1 to 25-N on the basis of both the intensity It of the beam EB emitted from the electron beam source 10 and the intensity IL of the beam EB that has passed through the active energy-selecting slit 25-L (step S116). Therefore, in this method of adjusting the monochromator 20, the active energy-selecting slit 25-L through which the electron beam EB has passed can be identified. This dispenses with a conventional procedure, for example, consisting of counting the number of actions for switching the slit width on operator's fingers and identifying what slit width is installed in the beam path. As a result, in this method, the monochromator 20 can be adjusted easily.

The method of adjusting the monochromator 20 in the electron microscope 100 includes the step S106 of controlling the energy filter 22 on the basis of the intensity IL of the electron beam EB that has passed through the active energy-selecting slit 25-L to adjust the position of the electron beam EB relative to the active energy-selecting slit 25-L taken in the direction where the beam EB is dispersed. Therefore, in this method of adjusting the monochromator 20, the position of the beam EB relative to the active energy-selecting slit 25-L taken in the direction of dispersion is adjusted by deflecting the electron beam EB. Consequently, the position can be adjusted more smoothly as compared, for example, to the case where the slit plate 24 is mechanically moved for adjusting purposes.

1.3. Modification of Method of Adjusting Monochromator

Figure 5:
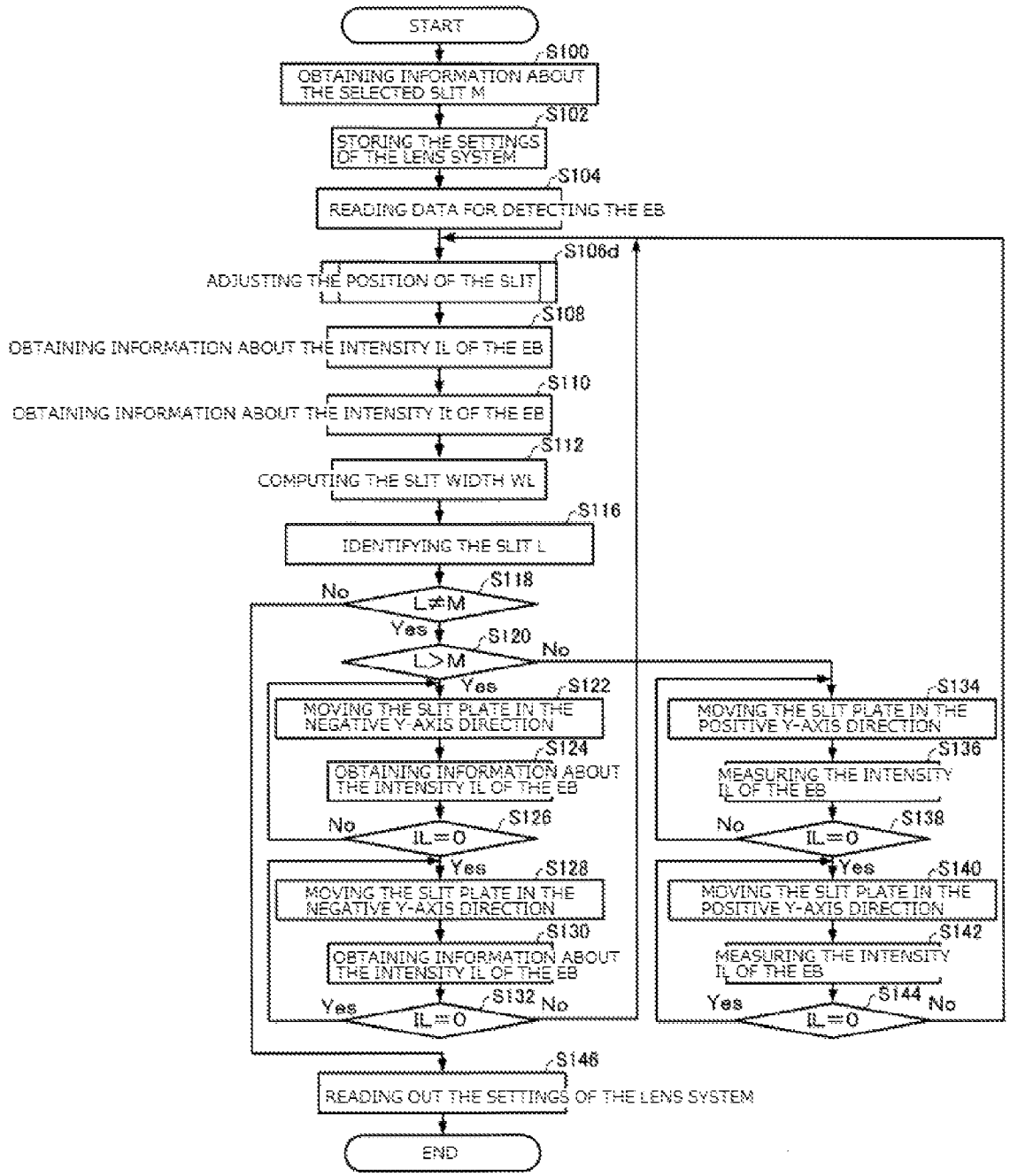
FIG. 5 is a flowchart similar to FIG. 3, but illustrating a modification of the method of adjusting the monochromator in the electron microscope shown in FIG. 1.

A modification of the method of adjusting the monochromator 20 in the electron microscope 100 associated with the first embodiment is next described by referring to FIG. 5, which is a flowchart illustrating the modification.

In the above-described method of adjusting the monochromator 20 associated with the first embodiment as illustrated in FIG. 3, at step S106, the slit position controller 74 controls the energy filter 22 on the basis of the results of measurements made by the second measuring section 60 to adjust the position of the electron beam EB relative to the active energy-selecting slit 25-L taken in the direction where the beam EB is dispersed.

In contrast, in the method associated with the present modification to adjust the monochromator 20 as illustrated in FIG. 5, at step S106d, the slit position controller 74 controls the moving mechanism 28 on the basis of the results of measurements made by the second measuring section 60 to adjust the position of the active energy-selecting slit 25-L through which the electron beam EB has passed, the position being taken in the direction of dispersion. The other steps of the flowchart of FIG. 5 are the same as the identically numbered steps of the flowchart of FIG. 3 and a description thereof is omitted.

Figure 6:
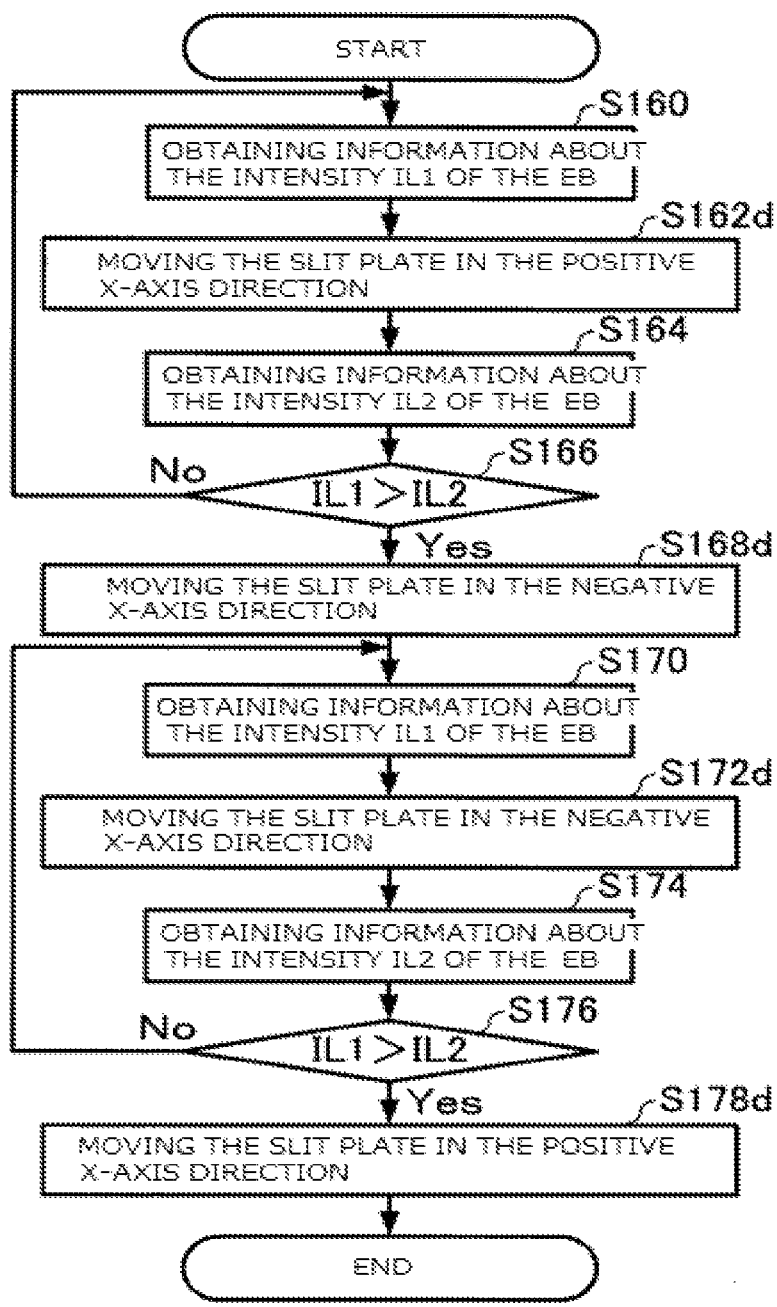
FIG. 6 is a flowchart illustrating one example of method of adjusting the position of an active energy-selecting slit in the electron microscope shown in FIG. 1, the position being taken in the direction of dispersion.

FIG. 6 is a flowchart illustrating one example of method of adjusting the position of the active energy-selecting slit 25-L taken in the direction of dispersion. In the flowchart of FIG. 6, steps similar to their corresponding steps of the flowchart of FIG. 4 are indicated by the same reference numerals as in FIG. 4 and a detailed description thereof is omitted.

First, the slit position controller 74 obtains information about the amount of current IL1 of the electron beam EB that has passed through the active energy-selecting slit 25-L, the amount of current being measured by the second measuring section 60 (step S160).

Then, the slit position controller 74 controls the moving mechanism 28 to move the slit plate 24 by the incremental distance ΔX in the positive X-axis direction (step S162d).

The slit position controller 74 then obtains information about the amount of current IL2 of the electron beam EB that has passed through the active energy-selecting slit 25-L, the amount of current being measured by the second measuring section 60 after the incremental movement of the slit plate 24 at step S162d (step S164).

The slit position controller 74 then makes a decision as to whether the amount of current IL1 is greater than the amount of current IL2 (i.e., IL1>IL2) (step S166).

If the decision at step S166 is No, indicating that the relation, IL1>IL2, is not satisfied, the slit position controller 74 again performs the steps S160, S162d, S164, and S166. The slit position controller 74 repeats the processing sequence of the steps S160, S162d, S164, and S166 until the relation, IL1>IL2, is satisfied.

If the decision at step S166 is Yes, indicating that the relation, IL1>IL2, is satisfied, the slit position controller 74 controls the moving mechanism 28 to move the slit plate 24 by the incremental distance ΔX in the negative X-axis direction (step S168d).

The slit position controller 74 then obtains information about the amount of current IL1 of the electron beam EB that has passed through the active energy-selecting slit 25-L, the amount of current being measured by the second measuring section 60 after the incremental movement of the slit plate 24 at step S168d (step S170).

The slit position controller 74 then controls the moving mechanism 28 to move the slit plate 24 by the incremental distance ΔX in the negative X-axis direction (step S172d).

The slit position controller 74 then obtains information about the amount of current IL2 of the electron beam EB that has passed through the active energy-selecting slit 25-L, the amount of current being measured by the second measuring section 60 after the incremental movement of the slit plate 24 at step S172d (step S174).

The slit position controller 74 then makes a decision as to whether the amount of current IL1 is greater than the amount of current IL2 (i.e., IL1>IL2) (step S176).

If the decision at step S176 is No, indicating that the relation, IL>IL2, is not satisfied, the slit position controller 74 again performs the steps S170, S172d, S174, and S176. The slit position controller 74 repeats the processing sequence of the steps S170, S172d, S174, and S176 until the relation, IL1>IL2, is satisfied.

If the decision at step S176 is Yes, indicating that the relation, IL1>IL2, is satisfied, the slit position controller 74 controls the moving mechanism 28 to move the slit plate 24 by the incremental distance ΔX in the positive X-axis direction (step S178d). Because of the processing described so far, the intensity center of the spectrum of the dispersed electron beam EB can be brought into coincidence with the widthwise center of the active energy-selecting slit 25-L taken in the X-axis direction by adjusting the position of the active energy-selecting slit 25-L through which the electron beam EB has passed, the position being taken in the direction of dispersion.

The electron microscope 100 associated with the present modification has the following features. In this microscope 100, the slit position controller 74 operates to control the moving mechanism 28 on the basis of the results of measurements made by the second measuring section 60 to adjust the position of the active energy-selecting slit 25-L that has passed through the electron beam EB, the position being taken in the direction of dispersion. Therefore, in this microscope 100 associated with the present modification, adjustment of the position of the active energy-selecting slit 25-L can be automated in the same way as in the first embodiment.

In the electron microscope 100 associated with the present modification, during the operation for varying the active energy-selecting slit 25-L through which the electron beam EB passes, the slit position controller 74 moves the slit plate 24 in the Y-axis direction (the first direction). During the operation for adjusting the position of the active energy-selecting slit 25-L taken in the direction of dispersion, the slit position controller 74 moves the slit plate 24 in the X-axis direction (the second direction). Therefore, in the electron microscope 100 associated with the present modification, the single moving mechanism 28 that moves the slit plate 24 along both X- and Y-axes can carry out both change of the active energy-selecting slit 25-L through which the electron beam EB passes and adjustment of the position of the active energy-selecting slit 25-L taken in the direction of dispersion. Consequently, in the electron microscope 100 associated with the present modification, the instrumental configuration can be simplified.

The method of adjusting the monochromator 20 in the electron microscope 100 associated with the present modification includes the step S106d for moving the position of the slit plate 24 on the basis of the intensity IL of the electron beam EB that has passed through the active energy-selecting slit 25-L to adjust the position of the active energy-selecting slit 25-L taken in the direction of dispersion. Consequently, an observation or analysis can be performed at an optimized electron beam brightness (or, at high brightness) can be performed.

In the method of adjusting the monochromator 20 in the electron microscope 100 associated with the present modification, during the process sequence of the steps S122-S132 and steps S134-S144 for changing the active energy-selecting slit 25-L through which the electron beam EB passes, the slit plate 24 is moved in the Y-axis direction. During the step S106d for adjusting the position of the active energy-selecting slit 25-L taken in the direction of dispersion, the slit plate 24 is moved in the X-axis direction. Consequently, in this method of adjusting the monochromator 20, both change of the active energy-selecting slit 25-L through which the electron beam EB passes and adjustment of the position of the active energy-selecting slit 25-L taken in the direction of dispersion can be carried out by moving the slit plate 24.

2. Second Embodiment
2.1. Electron Microscope

Figure 7:
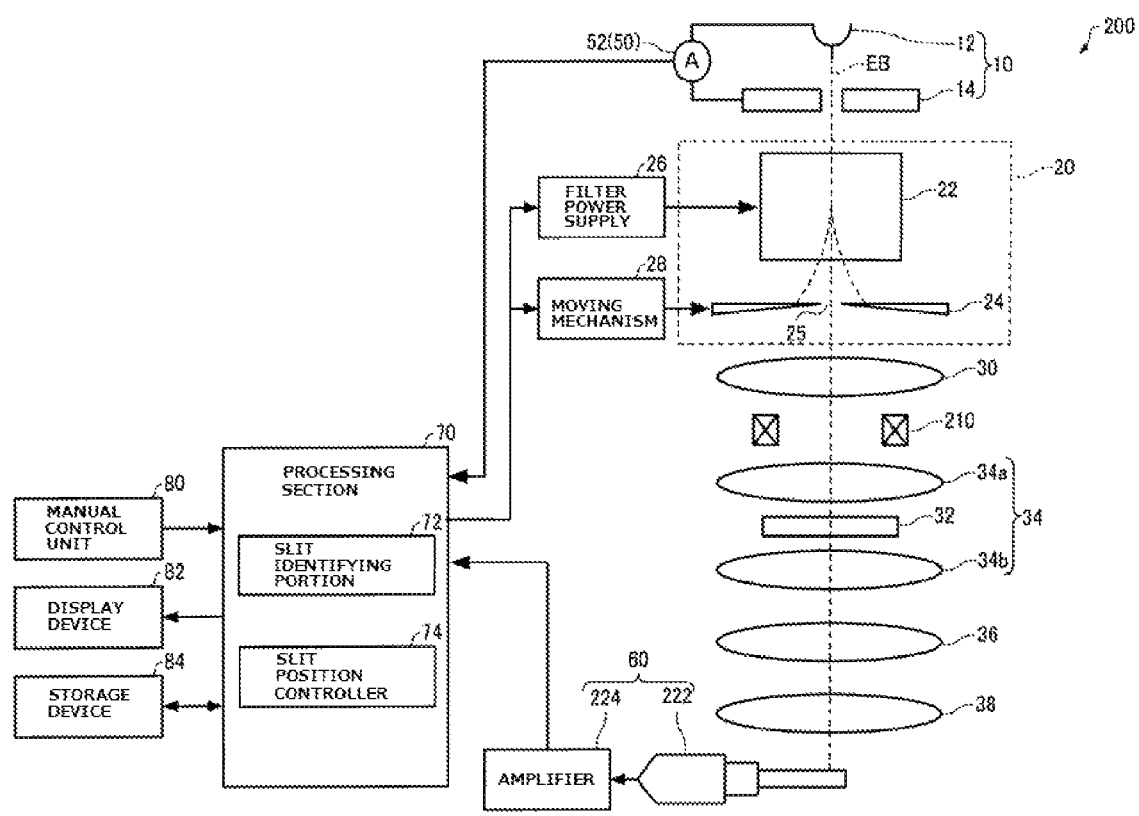
FIG. 7 is a schematic representation similar to FIG. 1, but showing an electron microscope associated with a second embodiment of the invention.

An electron microscope associated with a second embodiment of the present invention is next described by referring to FIG. 7, which schematically shows the configuration of this electron microscope, 200, associated with the second embodiment. Those members of the electron microscope 200 which are similar in function to their respective members of the above-described electron microscope 100 associated with the first embodiment are indicated by the same reference numerals as in the above referenced FIG. 1 and a description thereof is omitted.

The above-described electron microscope 100 associated with the first embodiment is a transmission electron microscope (TEM). In contrast, the electron microscope 200 is a scanning transmission electron microscope (STEM) which is an instrument for obtaining a scanning transmission electron microscope (STEM) image by scanning an electron probe over a sample and detecting electrons transmitted through the sample.

The electron microscope 200 is configured including an electron beam scanner 210 that deflects the electron beam EB to cause the electron beam (electron probe) focused by the condenser lens system 30 and the upper polepiece 34a of the objective lens 34 to be scanned over the sample. In the microscope 200, the condenser lens system 30 and the upper polepiece 34a of the objective lens 34 together constitute an illumination lens system. The electron beam scanner 210 is configured, for example, including scan coils for deflecting the electron beam EB. The electron beam scanner 210 scans the electron beam (electron probe) on the basis of a scan signal generated by a scan signal generator (not shown).

The second measuring section 60 is configured including an electron beam detector 222 and an amplifier 224. The electron beam detector 222 detects the electron beam EB guided by the imaging lens system of the electron microscope 200. The imaging lens system of the microscope 200 is composed of the lower polepiece 34b of the objective lens 34, the intermediate lens 36, and the projector lens 38. The electron beam detector 222 is configured including a scintillator for converting the incident electron beam EB into light, a light guide for guiding the light, and a photomultiplier tube (PMT) for converting the light guided by the light guide into an electrical signal. The electron beam detector 222 produces a detection signal indicating the count of the PMT. This detection signal is amplified by the amplifier 224 and sent to the processing section 70.

When the electron beam EB is detected using the electron beam detector 222, the focal distance of the lens system of the electron microscope 200 including the lenses 30, 34, 36, 38 and the deflection angle of the deflection coils (not shown) for deflecting the beam EB are so adjusted that the beam EB that has passed through the active energy-selecting slit 25-L is prevented from being interrupted in going from the slit 25-L to the beam detector 222. In the second measuring section 60, when the intensity IL of the electron beam passing through the active energy-selecting slit 25-L is measured, the gain of the amplifier 224 is adjusted such that levels of the intensity IL of the beam can be compared under constant conditions at all times using the count of the photomultiplier tube. Data about the focal distance of the lens system including the lenses 30, 34, 36, 38, data about the angle of deflection of the deflection coils, and data about the gain of the amplifier 224 which are used when the electron beam EB is detected using the electron beam detector 222 are previously stored in the storage device 84.

In the processing section 70, an operation for imaging the detection signal amplified by the amplifier 224 in synchronism with the scan signal is performed. A scanning transmission electron (STEM) image is obtained by synchronizing the detection signal with the scan signal and indicates a distribution of amounts of signal (intensities of the electron beam) corresponding to positions on the sample. In this way, the created STEM image is displayed on the display device 82.

The slit identifying portion 72 identifies the active energy-selecting slit 25-L through which the electron beam EB has passed from among the plural energy-selecting slits 25-1 to 25-N on the basis of the results of measurements made by the first and second measuring sections 50, 60. In particular, the slit identifying portion 72 finds the slit width WL of the active energy-selecting slit 25-L through which the electron beam EB has passed using Eq. (1) above from the results of measurements made by the first and second measuring sections 50, 60 and identifies the active energy-selecting slit 25-L.

In the electron microscope 200, the intensity IL of the electron beam EB passing through the active energy-selecting slit 25-L and included in Eq. (1) above is represented in terms of the output count (PMT count) of the photomultiplier tube. That is, the intensity IL of the beam EB passing through the active energy-selecting slit 25-L corresponds to the result of a measurement made by the second measuring section 60.

2.2. Method of Adjusting Monochromator

Figure 8:
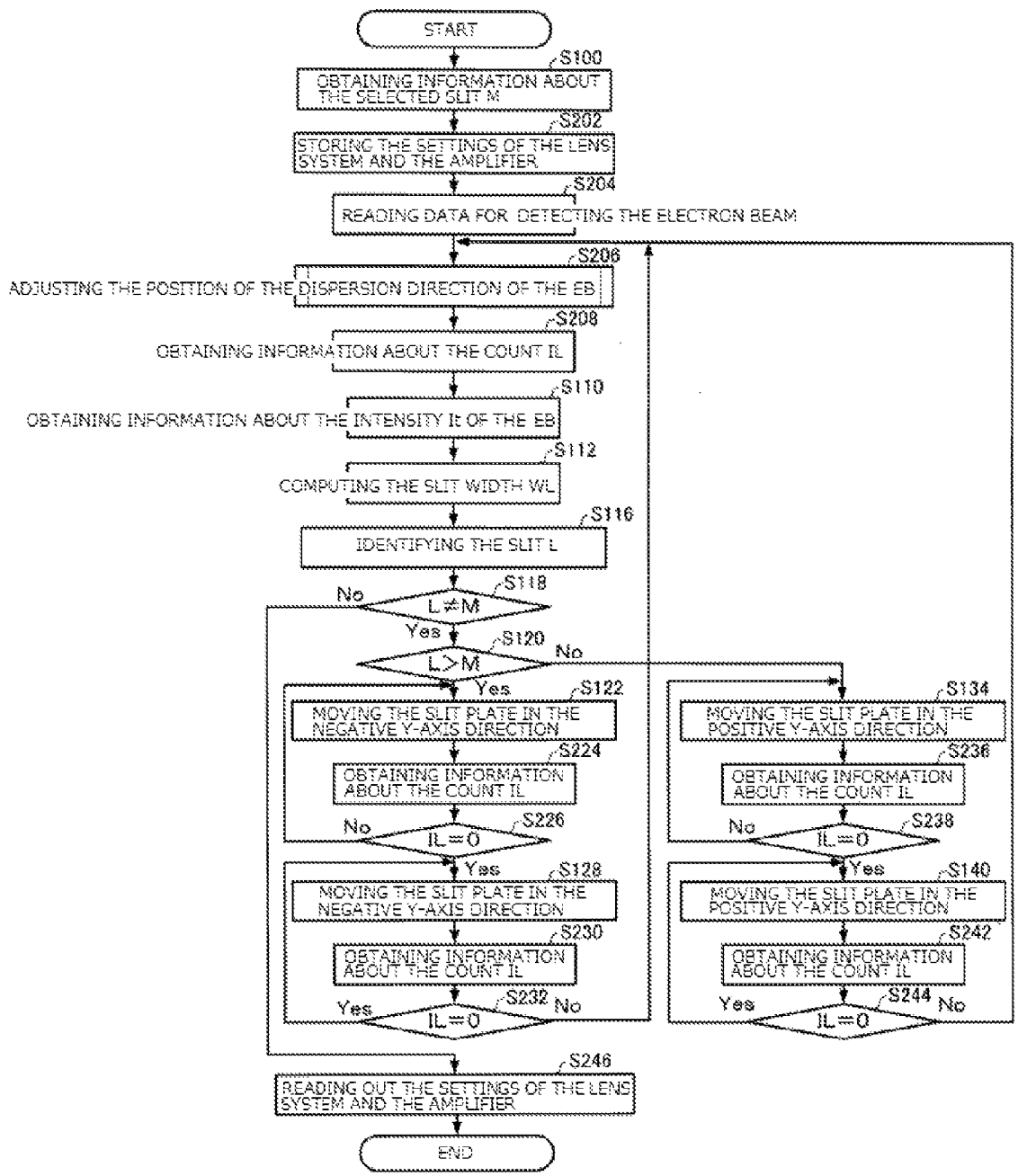
FIG. 8 is a flowchart illustrating one example of method of adjusting the monochromator in the electron microscope shown in FIG. 7.

A method of adjusting the monochromator 20 in the electron microscope 200 associated with the second embodiment is next described by referring to FIG. 8, which is a flowchart illustrating one example of the method of adjusting the monochromator 20 in the electron microscope 200. Those steps of the flowchart of FIG. 8 which are similar to their corresponding steps of the flowchart of FIG. 3 illustrating the first embodiment are indicated by the same reference numerals as in FIG. 3 and a detailed description thereof is omitted.

First, the processing section 70 obtains information about the desired energy-selecting slit 25-M selected by the operator (step S100).

Then, the processing section 70 stores the current settings of the lens system of the electron microscope 200 including the lenses 30, 34, 36, 38, the current settings of the deflection coils (not shown) for deflecting the electron beam EB, and the current settings of the amplifier 224 into the storage device 84 (step S202). For example, the processing section 70 stores information about the current focal distance of the lens system of the microscope 200 including the lenses 30, 34, 36, 38, information about the current angle of deflection of the deflection coils for deflecting the electron beam EB, and information about the current gain of the amplifier 224 into the storage device 84.

The processing section 70 then reads data about the focal distance of the lens system including the lenses 30, 34, 36, 38 for detecting the electron beam EB using the electron beam detector 222, data about the deflection angle of the deflection boils (not shown) for deflecting the beam EB, and data about the gain of the amplifier 224 from the storage device 84 (step S204). The processing section 70 sets the focal distance of the lens system including the lenses 30, 34, 36, 38, the deflection angle of the deflection coil, and the gain of the amplifier 224 on the basis of the data read out.

The slit position controller 74 then controls the energy filter 22 on the basis of the result of the measurement made by the second measuring section 60 to adjust the position of the electron beam EB relative to the energy-selecting slit 25 taken in the direction of dispersion (step S206). This can bring the intensity, center of the spectrum of the dispersed electron beam EB into coincidence with the widthwise center of the active energy-selecting slit 25-L taken in the X-axis direction. Details of the present step S206 will be described later.

The slit identifying portion 72 then obtains information about the intensity IL (PMT count) of the electron beam EB that has passed through the active energy-selecting slit 25-L, the intensity IL being measured by the second measuring section 60 (step S208).

The slit identifying portion 72 then obtains information about the intensity It of the electron beam emitted from the electron beam source 10, the intensity It being measured by the first measuring section 50 (step S110).

The slit identifying portion 72 then finds the slit width WL of the active energy-selecting slit 25-L using Eq. (1) on the basis of both the result of the measurement (amount of current It) made by the first measuring section 50 and the result of the measurement (IL (PMT count)) made by the second measuring section 60 (step S112).

The slit identifying portion 72 then identifies the active energy-selecting slit 25-L from the found slit width WL of the active energy-selecting slit 25-L (step S116).

The slit position controller 74 then makes a decision as to whether the active energy-selecting slit 25-L identified by the slit identifying portion 72 disagrees with the desired energy-selecting slit 25-M (step S118).

If the decision at step S118 is Yes, indicating that the identified energy-selecting slit 25-L disagrees with the desired energy-selecting slit 25-M, the slit position controller 74 makes a decision as to whether a relation, L>M, is satisfied (step S120).

If the decision at step S120 is Yes, indicating that relation, L>M, is satisfied, the slit position controller 74 controls the moving mechanism 28 to move the slit plate 24 by the incremental distance ΔY in the negative Y-axis direction (step S122).

The slit position controller 74 then obtains information about the PMT count IL of the electron beam EB that has passed through the active energy-selecting slit 25-L, the count being measured by the second measuring section 60 after the slit plate 24 is moved incrementally at step S122 (step S224).

The slit position controller 74 then makes a decision as to whether the PMT count IL obtained at step S224 satisfies the relation, IL=0 (step S226). The relation, IL=0, indicates a state in which the path of the electron beam EB is located between the adjacent energy-selecting slits 25-L and 25-(L−1) and the beam EB is interrupted by the slit plate 24.

If the decision at step S226 is No, indicating that the relation, IL=0, is not satisfied, the slit position controller 74 again moves the slit plate 24 by the incremental distance ΔY in the negative Y-axis direction (step S122) and obtains information about the PMT count IL of the electron beam EB after the incremental movement of the slit plate 24 (step S224). The slit position controller 74 repeats the processing sequence of the steps S122, S224, and S226 until the relation, IL=0, is satisfied.

If the decision at step S226 is Yes, indicating that the relation, IL=0, is satisfied, the slit position controller 74 controls the moving mechanism 28 to move the slit plate 24 by the incremental distance ΔY in the negative Y-axis direction (step S128).

The slit position controller 74 then obtains information about the PMT count IL of the electron beam EB, the count being measured by the second measuring section 60 after the incremental movement of the slit plate 24 at step S128 (step S230).

The slit position controller 74 then makes a decision as to whether the PMT count IL obtained at step S128 satisfies the relation, IL=0, (step S232).

If the decision at step S232 is No, indicating that the relation, IL=0, is satisfied, the slit position controller 74 again moves the slit plate 24 by the incremental distance ΔY in the negative Y-axis direction (step S128) and obtains information about the PMT count IL derived from the electron beam EB after the slit plate 24 has been moved incrementally (step S230). The slit position controller 74 repeats the processing sequence of the steps of S128, S230, and 5232 until the relation, IL=0, is no longer satisfied, i.e., until the beam path of the electron beam EB is placed at the next energy-selecting slit 25-(L−1).

If the decision at step S232 is No, indicating that the relation, IL=0, is not satisfied, i.e., the electron beam EB has passed through the energy-selecting slit 25-(L−1), the slit position controller 74 controls the energy filter 22 on the basis of the result of the measurement made by the second measuring section 60 to adjust the position of the beam EB relative to the active energy-selecting slit 25-L (L=L−1) in the direction of dispersion (step S206). Consequently, the intensity center of the spectrum of the dispersed beam EB can be brought into coincidence with the widthwise center of the active energy-selecting slit 25-L taken in the X-axis direction.

If the decision at step S120 is No, indicating that the relation, L>M, is not satisfied, the slit position controller 74 controls the moving mechanism 28 to move the slit plate 24 by the incremental distance ΔY in the positive Y-axis direction (step S134).

The slit position controller 74 then obtains information about the PMT count IL of the electron beam EB, the count being measured by the second measuring section 60 after the incremental movement of the slit plate 24 at step S134 (step S236).

The slit position controller 74 then makes a decision as to whether the PMT count IL obtained at step S236 satisfies the relation, IL=0, (step S238).

If the decision at step S238 is No, indicating that the relation, IL=0, is not satisfied, the slit position controller 74 again moves the slit plate 24 by the incremental distance ΔY in the positive Y-axis direction (step S134) and obtains information about the PMT count IL of the electron beam EB derived after the incremental movement of the slit plate 24 (step S236). The slit position controller 74 repeats the processing sequence of the steps S134, S236, and S238 until the relation, IL=0, is satisfied.

If the decision at step S238 is Yes, indicating that the relation, IL=0, is satisfied, the slit position controller 74 controls the moving mechanism 28 to move the slit plate 24 by the incremental distance ΔY in the positive Y-axis direction (step S140).

The slit position controller 74 then obtains information about the PMT count IL of the electron beam EB, the count being measured by the second measuring section 60 after the incremental movement of the slit plate 24 at step S140 (step S242).

The slit position controller 74 then makes a decision as to whether the PMT count IL obtained at step S242 satisfies the relation, IL=0, (step S244).

If the decision at step S244 is Yes, indicating that the relation, IL=0, is satisfied, the slit position controller 74 again moves the slit plate 24 by the incremental distance ΔY in the positive Y-axis direction (step S140) and obtains information about the PMT count IL of the electron beam EB after the incremental movement of the slit plate 24 (step S242). The slit position controller 74 repeats the processing sequence of the steps S140, S242, and S244 until the relation, IL=0, is no longer satisfied, i.e., the beam path of the electron beam EB is located at the next energy-selecting slit 25-(L+1).

If the decision at step S244 is No, indicating that the relation, IL=0, is not satisfied, i.e., the beam path of the electron beam EB is located at the energy-selecting slit 25-(L+1), the slit position controller 74 controls the energy filter 22 on the basis of the result of the measurement made by the second measuring section 60 to adjust the position of the beam EB relative to the active energy-selecting slit 25-L (L=L+1) taken in the direction of dispersion (step S206). Consequently, the intensity center of the spectrum of the dispersed electron beam EB can be brought into coincidence with the widthwise center of the active energy-selecting slit 25-L taken in the X-axis direction.

The processing section 70 repeats the processing sequence of the steps S206-S244 until the active energy-selecting slit 25-L and the desired energy-selecting slit 25-M agree, i.e., until the decision at step S118 becomes negative.

If the decision at step S118 is No, signifying that the active energy-selecting slits 25-L and the desired energy-selecting slit 25-M agree, the processing section 70 reads out the settings of the lens system of the electron microscope 200 including the lenses 30, 34, 36, 38, the settings of the deflection coils (not shown), and the settings of the amplifier 224 stored in the storage device 84 at step S202 (step S246). The processing section 70 sets the lens system including the lenses 30, 34, 36, 38, deflection coils, and amplifier 224 on the basis of information about these settings. Consequently, the lens system of the electron microscope 200 including the lenses 30, 34, 36, 38, deflection coils, and amplifier 224 can be returned to their state assumed prior to adjustment of the monochromator 20. The processing section 70 ends the present processing subroutine. Because of the processing described so far, the energy-selecting slit 25-M selected by the operator can be placed in the path of the electron beam EB.

Figure 9:
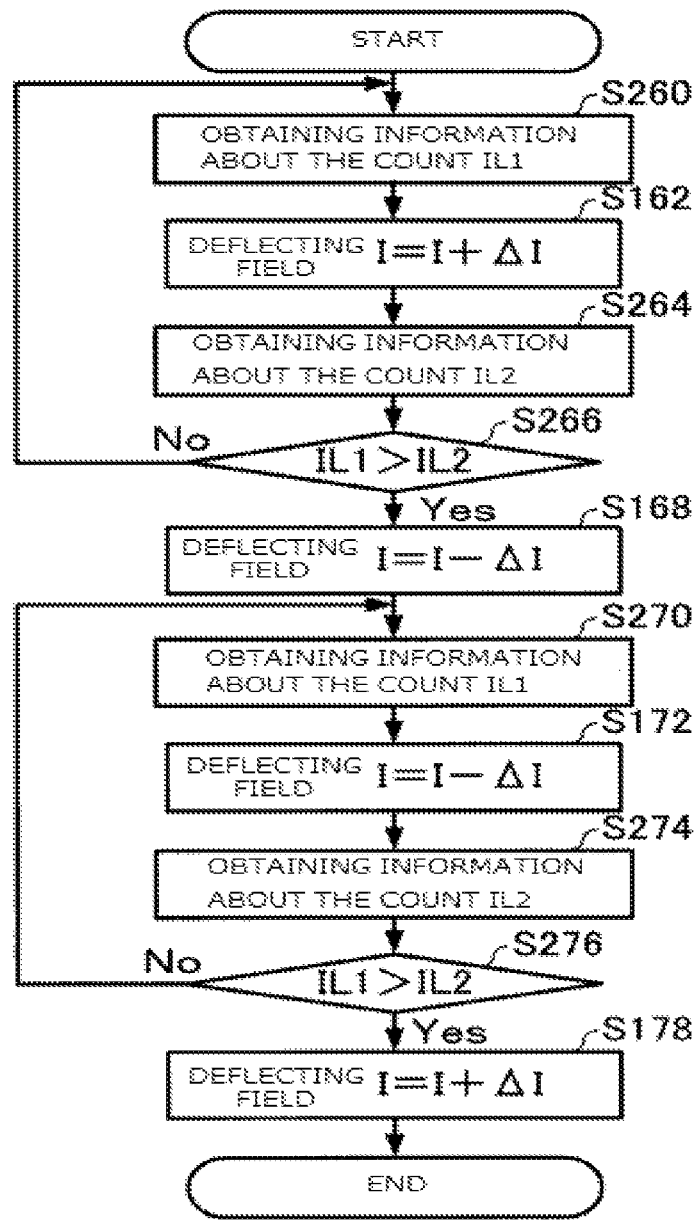
FIG. 9 is a flowchart illustrating one example of method of adjusting the position of the electron beam relative to an active energy-selecting slit in the electron microscope shown in FIG. 7, the position being taken in the direction of dispersion.

The step S206 of adjusting the position of the electron beam EB relative to the active energy-selecting slit 25-L taken in the direction of dispersion by controlling the energy filter 22 on the basis of the result of the measurement made by the second measuring section 60 is next described by referring to FIG. 9, which is a flowchart illustrating one example of the method of adjusting the position of the electron beam EB relative to the active energy-selecting slit 25-L taken in the direction of dispersion. Those steps of the flowchart of FIG. 9 which are similar to their corresponding steps of the above-described flowchart of FIG. 4 are indicated by the same reference numerals as in FIG. 4 and a detailed description thereof is omitted.

First, the slit position controller 74 obtains information about the PMT count IL1 of the electron beam EB that has passed through the active energy-selecting slit 25-L, the count being measured by the second measuring section 60 (step S260).

Then, the slit position controller 74 increases the output I of the filter power supply 26 by the incremental amount ΔI to move the position of the electron beam EB on the slit plate 24 by the incremental distance ΔX in the positive X-axis direction (step S162).

The slit position controller 74 then obtains information about the PMT count IL2 of the electron beam EB that has passed through the active energy-selecting slit 25-L, the count being measured by the second measuring section 60 after the incremental movement of the position of the beam EB at step S162 (step S264).

The slit position controller 74 then makes a decision as to whether the PMT count IL1 is greater than the PMT count LI2 (i.e., IL1>IL2) (step S266).

If the decision at step S266 is No, indicating that the relation, IL1>IL2, is not satisfied, the slit position controller 74 again performs the steps S260, S162, S264, and S266. The slit position controller 74 repeats the processing sequence of the steps S260, S162, S264, and S266 until the relation, IL1>IL2, is satisfied.

If the decision at step S266 is Yes, signifying that the relation, IL1>IL2, is satisfied, the slit position controller 74 reduces the output I of the filter power supply 26 by the incremental amount ΔI to move the position of the electron beam EB on the slit plate 24 by the incremental distance ΔX in the negative X-axis direction (step S168).

The slit position controller 74 then obtains information about the PMT count IL1 of the electron beam EB that has passed through the active energy-selecting slit 25-L, the count being measured by the second measuring section 60 after the incremental movement of the position of the beam EB at step S168 (step S270).

The slit position controller 74 then reduces the output I of the filter power supply 26 by the incremental amount ΔI to move the position of the electron beam EB on the slit plate 24 by the incremental distance ΔX in the negative X-axis direction (step S172).

The slit position controller 74 then obtains information about the PMT count IL2 of the electron beam EB that has passed through the active energy-selecting slit 25-L, the count being measured by the second measuring section 60 after the incremental movement of the position of the beam EB at step S172 (step S274).

Then, the slit position controller 74 makes a decision as to whether the PMT count IL1 is greater than the PMT count IL2 (i.e., IL1>IL2) (step S276).

If the decision at step S276 is No, indicating that the relation, IL1>IL2, is not satisfied, the slit position controller 74 again performs the steps S270, S172, S274, and S276. The slit position controller 74 repeats the processing sequence of the steps S270, S172, S274, and S276 until the relation, IL1>IL2, is satisfied.

If the decision at step S276 is Yes, indicating that the relation, IL1>IL2, is satisfied, the slit position controller 74 increases the output I of the filter power supply 26 by the incremental amount ΔI to move the position of the electron beam EB on the slit plate 24 by the incremental distance ΔX in the positive X-axis direction (step S178).

Because of the processing described so far, the intensity center of the spectrum of the dispersed electron beam EB can be brought into coincidence with the widthwise center of the active energy-selecting slit 25-L taken in the X-axis direction by adjusting the position of the beam EB relative to the active energy-selecting slit 25-L taken in the direction of dispersion.

The electron microscope 200 associated with the second embodiment can yield advantageous effects similar to those produced by the above-described electron microscope 100 associated with the first embodiment. Similarly, the method of adjusting the monochromator 20 in the electron microscope 200 associated with the second embodiment can yield advantageous effects similar to those produced by the above-described method of adjusting the monochromator 20 in the electron microscope 100 associated with the first embodiment.

2.3. Modification of Method of Adjusting Monochromator

Figure 10:
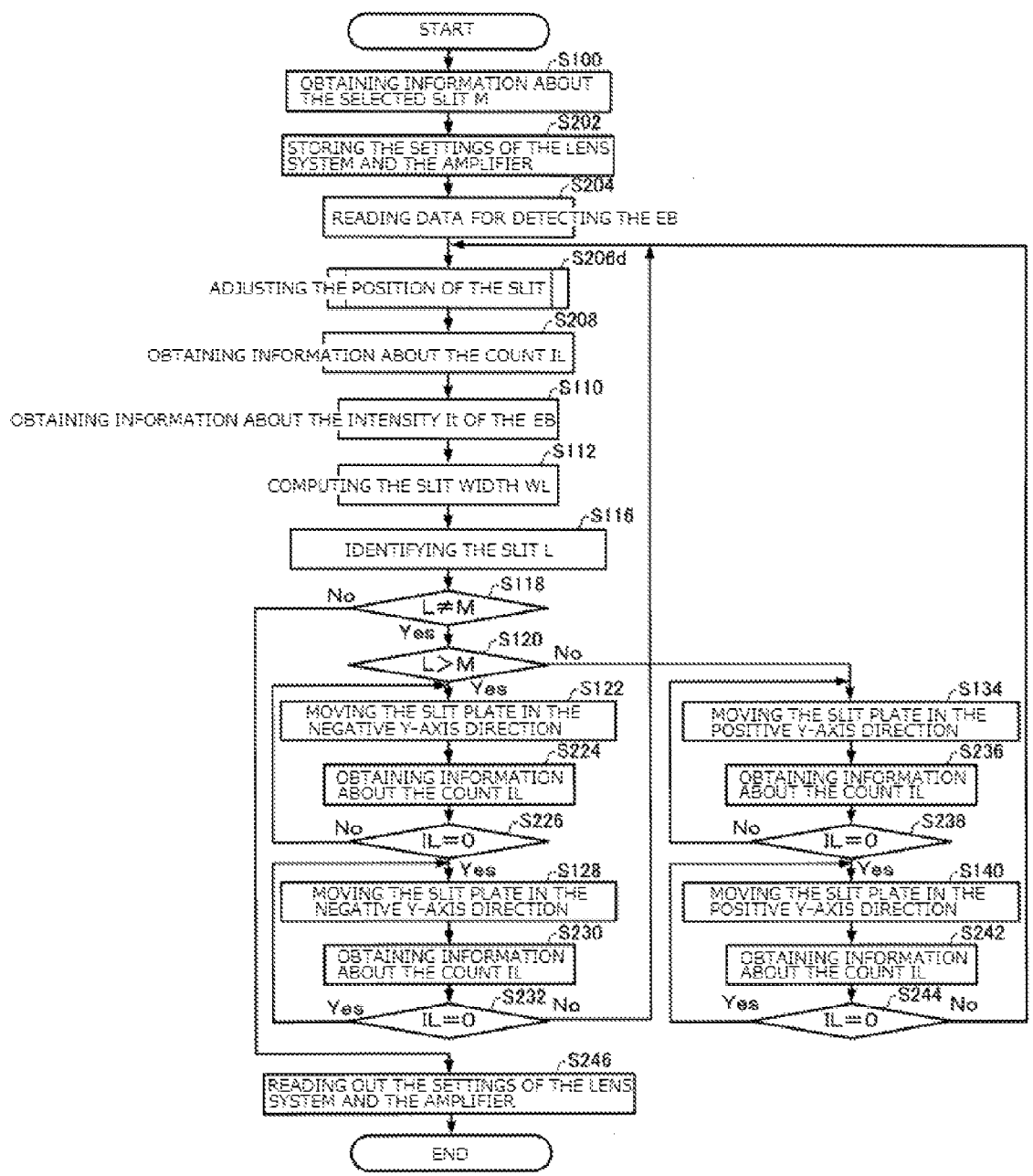
FIG. 10 is a flowchart similar to FIG. 8, but illustrating a modification of the method illustrated in FIG. 8.

A modification of the method of adjusting the monochromator 20 in the electron microscope 200 associated with the second embodiment is next described by referring to FIG. 10, which is a flowchart illustrating this modified method of adjusting the monochromator 20 in the microscope 200.

In the above-described method of adjusting the monochromator 20 associated with the second embodiment as illustrated in FIG. 8, the slit position controller 74 controls the energy filter 22 on the basis of the results of measurements made by the second measuring section 60 to adjust the position of the electron beam EB relative to the active energy-selecting slit 25-L taken in the direction of dispersion at step S206.

In contrast, in the method associated with the present modification to adjust the monochromator 20 as illustrated in FIG. 10, the slit position controller 74 controls the moving mechanism 28 on the basis of the results of measurements made by the second measuring section 60 to adjust the position of the active energy-selecting slit 25-L through which the electron beam EB has passed at step S206d, the position being taken in the direction of dispersion.

The other steps of the flowchart of FIG. 10 are the same as their identically numbered steps of the flowchart of FIG. 8 and a description thereof is omitted.

Figure 11:
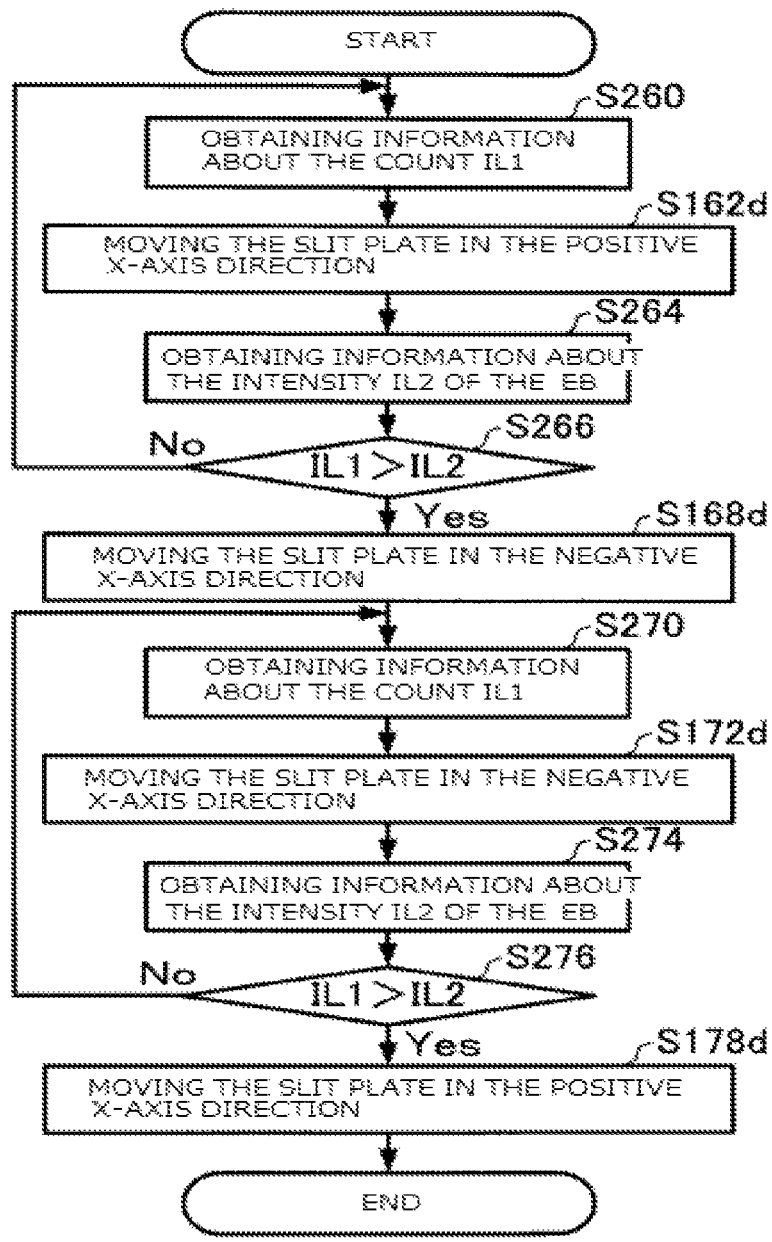
FIG. 11 is a flowchart illustrating one example of method of adjusting the position of an active energy-selecting slit in the electron microscope shown in FIG. 7, the position being taken in the direction of dispersion.

FIG. 11 is a flowchart illustrating one example of the method of adjusting the position of the active energy-selecting slit 25-L taken in the direction of dispersion. Those steps of the flowchart of FIG. 11 which are similar to their corresponding steps of the flowcharts of FIGS. 6 and 9 are indicated by the same reference numerals as in FIGS. 6 and 9 and a described description thereof is omitted.

First, the slit position controller 74 obtains information about the PMT count IL1 of the electron beam EB that has passed through the active energy-selecting slit 25-L, the count being measured by the second measuring section 60 (step S260).

The slit position controller 74 then controls the moving mechanism 28 to move the slit plate 24 by the incremental distance $\Delta X$ in the positive X-axis direction (step S162$d$).

The slit position controller 74 then obtains information about the PMT count IL2 of the electron beam EB that has passed through the active energy-selecting slit 25-L, the count being measured by the second measuring section 60 after the incremental movement of the slit plate 24 at step S162$d$ (step S264).

The slit position controller 74 then makes a decision as to whether the PMT count IL1 is greater than the PMT count IL2 (i.e., IL1>IL2) (step S266).

If the decision at step S266 is No, indicating that the relation, IL1>IL2, is not satisfied, the slit position controller 74 again performs the steps S260, S162$d$, S264, and S266. The slit position controller 74 repeats the processing sequence of the steps S260, S162$d$, S264, and S266 until the relation, IL1>IL2, is satisfied.

If the decision at step S266 is Yes, indicating that the relation, IL1>IL2, is satisfied, the slit position controller 74 controls the moving mechanism 28 to move the slit plate 24 by the incremental distance $\Delta X$ in the negative X-axis direction (step S168$d$).

The slit position controller 74 then obtains information about the PMT count IL1 of the electron beam EB that has passed through the active energy-selecting slit 25-L, the count being measured by the second measuring section 60 after the incremental movement of the slit plate 24 at step S168$d$ (step S270).

The slit position controller 74 then controls the moving mechanism 28 to move the slit plate 24 by the incremental distance $\Delta X$ in the negative X-axis direction (step S172$d$).

The slit position controller 74 then obtains information about the PMT count IL2 of the electron beam EB that has passed through the active energy-selecting slit 25-L, the count being measured by the second measuring section 60 after the incremental movement of the slit plate 24 at step S172$d$ (step S274).

The slit position controller 74 then makes a decision as to whether the PMT count IL1 is greater than the PMT count IL2 (i.e., IL1>IL2) (step S276).

If the decision at step S276 is No, indicating that the relation, IL1>IL2, is not satisfied, the slit position controller 74 again performs the steps S270, S172$d$, S274, and S276. The slit position controller 74 repeats the processing sequence of the steps 270, S172$d$, S274, and S276 until relation, IL1>IL2, is satisfied.

If the decision at step S276 is Yes, indicating that the relation, IL1>IL2, is satisfied, the slit position controller 74 controls the moving mechanism 28 to move the slit plate 24 by the incremental distance $\Delta X$ in the positive X-axis direction (step S178$d$).

Because of the processing described so far, the intensity center of the spectrum of the dispersed electron beam EB can be brought into coincidence with the widthwise center of the active energy-selecting slit 25-L taken in the X-axis direction by adjusting the position of the active energy-selecting slit 25-L through which the beam EB has passed, the position being taken in the direction of dispersion.

The method associated with the present modification to adjust the monochromator 20 in the electron microscope 200 yields advantageous effects similar to those produced by the method associated with the second embodiment to adjust the monochromator 20 in the electron microscope 200.

3. Third Embodiment 3.1. Electron Microscope

Figure 12:
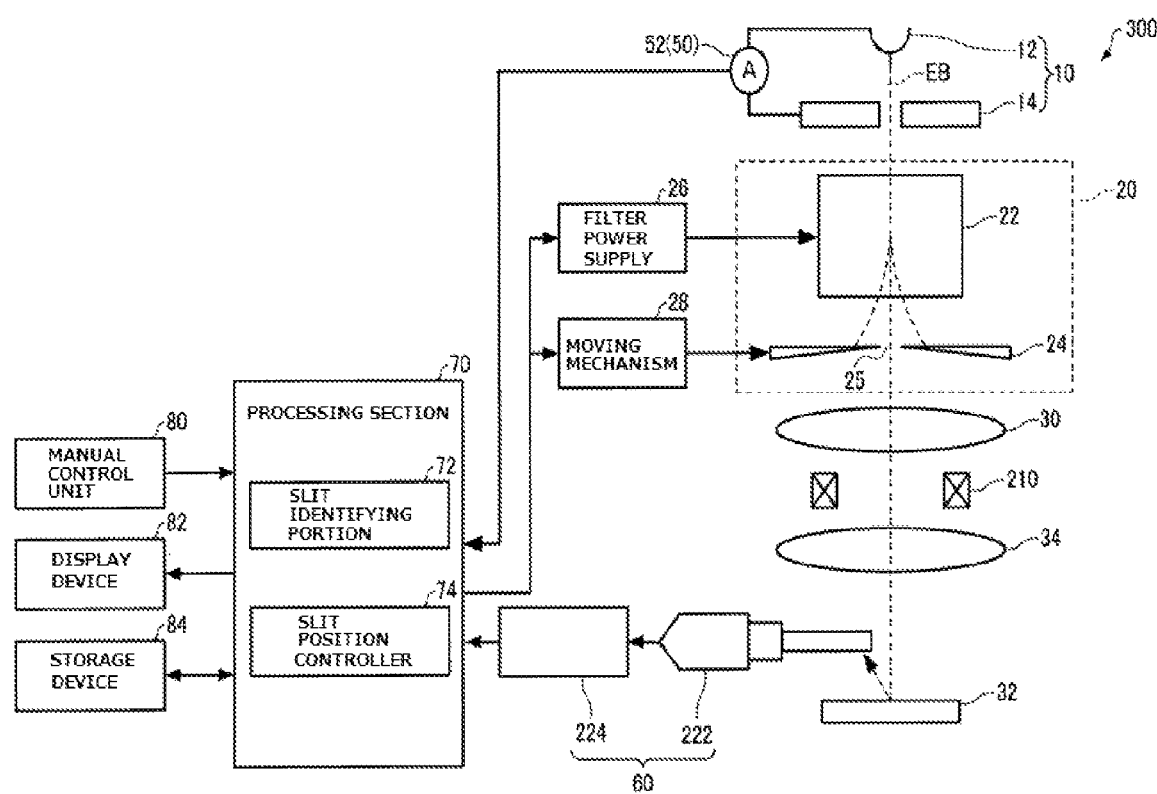
FIG. 12 is a schematic representation similar to FIGS. 1 and 7, but showing an electron microscope associated with a third embodiment of the invention.

An electron microscope associated with a third embodiment of the present invention is next described by referring to FIG. 12, which schematically shows the configuration of the electron microscope, 300, associated with the third embodiment. Those members of the electron microscope 300 associated with the third embodiment which are similar in function to their respective counterparts of the electron microscope 100 associated with the first embodiment and the electron microscope 200 associated with the second embodiment are indicated by the same reference numerals as in the above referenced figures and a description thereof is omitted.

The above-described electron microscope 100 associated with the first embodiment is a transmission electron microscope (TEM). In contrast, the electron microscope 300 is a scanning electron microscope (SEM). As shown in FIG. 12, the electron microscope 300 includes an electron beam source 10, a monochromator 20, a moving mechanism 28, a condenser lens system 30, an objective lens 34, an electron beam scanner 210, a sample stage 32, a first measuring section 50, a second measuring section 60, a processing section 70, a manual control unit 80, a display device 82, and a storage device 84.

In the electron microscope 300, the electron beam EB generated by the electron beam source 10 is constricted by the lens system including the lenses 30 and 34 to produce an electron probe. This probe is scanned over the sample surface by the electron beam scanner 210. At this time, secondary electrons or backscattered electrons emitted from the point on the surface irradiated with the electron probe are detected by an electron beam detector (such as a secondary electron detector) 222 and imaged.

A slit identifying portion 72 identifies an active energy-selecting slit 25-L through which the electron beam EB has passed from among plural energy-selecting slits 25-1 to 25-N on the basis of the results of measurements made by the first and second measuring sections 50, 60. In particular, the slit identifying portion 72 identifies the active energy-selecting slit 25-L by finding the slit width WL of the active energy-selecting slit 25-L using Eq. (1) above from the results of measurements made by the first and second measuring sections 50, 60.

In the electron microscope 300, the intensity IL of the electron beam EB which passes through the active energy-selecting slit 25-L and which is included in Eq. (1) above is represented in terms of an output count (PMT count) of a photomultiplier tube (PMT) that is produced when the electron beam EB passing through the active energy-selecting slit 25-L hits a sample and backscattered electrons or secondary electrons emitted from the sample are detected by the electron beam detector 222. That is, the intensity IL of the electron beam EB passing through the active energy-selecting slit 25-L corresponds to the result of a measurement made by the second measuring section 60.

The second measuring section 60 indirectly measures the intensity IL of the electron beam EB passing through the active energy-selecting slit 25-L by detecting the secondary or backscattered electrons emanating from a sample when it is irradiated with the electron beam EB passing through the active energy-selecting slit 25-L and producing an output signal as a PMT count.

3.2. Method of Adjusting Monochromator

A method of adjusting the monochromator 20 in the electron microscope 300 associated with the third embodiment is next described. In the above-described method of adjusting the monochromator 20 in the electron microscope 200 associated with the second embodiment, the electron beam EB passing through the active energy-selecting slit 25-L is detected by the electron beam detector (such as a photomultiplier tube) 222 in the second measuring section 60. The output count (PMT count) of the photomultiplier tube is represented as the intensity IL of the electron beam EB that has passed through the active energy-selecting slit 25-L, and the monochromator 20 is adjusted.

In contrast, in the method of adjusting the monochromator 20 in the electron microscope 300 associated with the third embodiment, the intensity of secondary or backscattered electrons emitted from a sample is detected by the electron beam detector (such as a photomultiplier tube) 222 in the second measuring section 60 when the sample is irradiated with the electron beam EB passing through the active energy-selecting slit 25-L. The output count (PMT count) of the photomultiplier tube is represented as the intensity IL of the beam EB passing through the active energy-selecting slit 25-L, and the monochromator 20 is adjusted.

In other respects, the method of adjusting the monochromator 20 in the electron microscope 300 associated with the third embodiment is similar to the above-described method of adjusting the monochromator 20 in the electron microscope 200 shown in FIG. 8 and associated with the second embodiment and a description thereof is omitted.

The electron microscope 300 associated with the third embodiment can yield advantageous effects similar to those produced by the above-described electron microscope 100 associated with the first embodiment. Similarly, the method of adjusting the monochromator 20 in the electron microscope 300 associated with the third embodiment can yield advantageous effects similar to those produced by the above-described method of adjusting the monochromator 20 in the electron microscope 100 associated with the first embodiment.

The modification of the method of adjusting the monochromator 20 in the electron microscope 200 associated with the second embodiment (described under caption 2.3.) is similarly applicable to the method of adjusting the monochromator 20 in the electron microscope 300 associated with the third embodiment.

4. Other Embodiments

It is to be noted that the present invention is not restricted to the above-described embodiments but rather can be practiced in various forms without departing from the gist of the present invention.

For example, in the above-described electron microscope 100 associated with the first embodiment, the second measuring section 60 measures the intensity (amount of current) of the electron beam EB that has passed through the active energy-selecting slit 25-L using the Faraday cup 62 and the ammeter 64 connected with the Faraday cup 62 as shown in FIG. 1. Alternatively, the amount of current of the electron beam EB that is absorbed by the slit plate 24 without passing through the active energy-selecting slit 25-L may be measured, and the intensity (amount of current) of the beam EB passing through the active energy-selecting slit 25-L may be found from the result of the measurement. That is, the intensity (amount of current) of the electron beam EB that has passed through the active energy-selecting slit 25-L may be measured indirectly from the amount of current of the electron beam EB absorbed by the slit plate 24.

Figure 13:
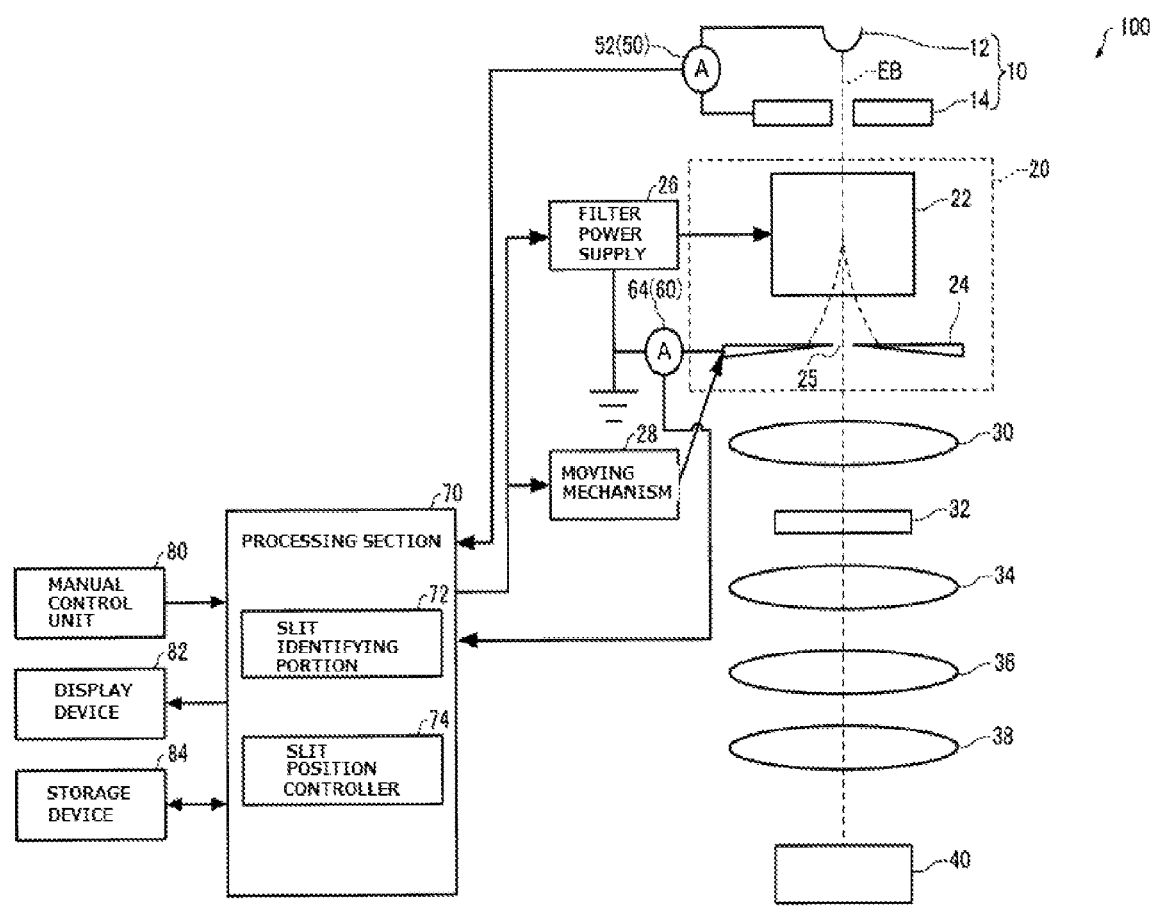
FIG. 13 is a schematic representation similar to FIG. 1, but also showing a configuration for measuring the amount of current of the electron beam absorbed by the slit plate.

FIG. 13 schematically shows a configuration of the electron microscope 100 for measuring the amount of current of the electron beam EB absorbed by the slit plate 24.

As shown in FIG. 13, the second measuring section 60 is configured including an ammeter 64 incorporated between a point on the filter power supply 26 at ground potential and the slit plate 24. The ammeter 64 can measure the amount of current of the electron beam EB that is absorbed by the slit plate 24 without passing through the active energy-selecting slit 25-L. The result of the measurement made by the ammeter 64 is sent to the processing section 70.

The amount of current of the electron beam EB that has passed through the active energy-selecting slit 25-L is the difference between the total amount of current of the beam EB incident on the slit plate 24 from the energy filter 22 and the amount of current of the beam EB absorbed by the slit plate 24. Therefore, the amount of current of the electron beam EB that has passed through the active energy-selecting slit 25-L can be measured indirectly by measuring the amount of current of the beam EB absorbed by the slit plate 24.

The total amount of current of the electron beam EB entering the slit plate 24 from the energy filter 22 can be found by measuring the amount of current absorbed by the slit plate 24, for example, while setting the amount of current of the beam EB passing through the active energy-selecting slit 25-L to zero, i.e., the beam EB is totally interrupted by the slit plate 24.

The amount of current of the electron beam EB passing through the active energy-selecting slit 25-L can be measured more precisely by measuring the amount of current of the beam EB absorbed by the slit plate 24, i.e., by indirectly measuring the amount of current of the beam EB that has passed through the active energy-selecting slit 25-L, for example, as compared to the case where the Faraday cup 62 is disposed behind the projector lens 38 and the amount of current of the beam EB is directly measured as shown in FIG. 1.

If the Faraday cup 62 is disposed behind the projector lens 38 and the amount of current is measured, the electron beam EB will be cut off by the optical system which includes lenses and apertures in going from the active energy-selecting slit 25-L to the Faraday cup 62. As a result, the amount of current passing through the active energy-selecting slit 25-L may not be measured correctly. In contrast, where the amount of current of the electron beam EB that has passed through the active energy-selecting slit 25-L is indirectly measured from the amount of current of the beam EB absorbed by the slit plate 24, such a problem does not occur and the amount of current of the electron beam EB that has passed through the active energy-selecting slit 25-L can be measured more precisely.

The modification illustrated in FIG. 13 is similarly applicable to the electron microscope (STEM) 200 associated with the second embodiment and to the electron microscope (SEM) 300 associated with the third embodiment.

It is to be noted that the above-described embodiments and modification are merely exemplary and that the present invention is not restricted thereto. For example, the embodiments and modification may be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An electron microscope comprising:
   an electron beam source emitting an electron beam;
   a monochromator having an energy filter for dispersing the electron beam according to energy and a slit plate placed on an energy dispersive plane, the slit plate being provided with plural energy-selecting slits that are different in width taken in a direction where the electron beam is dispersed;
   a lens system on which the electron beam impinges after the beam is monochromatized by the monochromator;
   a first measuring section for measuring the intensity of the electron beam emitted from the electron beam source;
   a second measuring section for measuring the intensity of the electron beam that has passed through an active one of the energy-selecting slits; and
   a slit identifying portion for identifying the active energy-selecting slit through which the beam has passed from among the plural energy-selecting slits on the basis of results of measurements made by the first and second measuring sections.

2. The electron microscope as set forth in claim 1, Wherein said slit identifying portion finds the width, WL, of said active energy-selecting slit using the following equation and identifies the active energy-selecting slit through which the electron beam has passed:

$$IL = \alpha \cdot WL \cdot It$$

where IL is the intensity of the electron beam measured by the second measuring section, It is the intensity of the electron beam measured by the first measuring section, and $\alpha$ is a proportional constant.

3. The electron microscope as set forth in claim 1, further comprising:
   a moving mechanism for moving the position of said slit plate; and
   a slit position controller for controlling the moving mechanism,
   wherein the slit position controller performs an operation for making a decision as to whether the active energy-selecting slit identified by said slit identifying portion is coincident with a desired one of the plural energy-selecting slits and an operation for controlling the moving mechanism on the basis of the result of the decision to move the position of the slit plate, for changing the active energy-selecting slit through which the electron beam passes.

4. The electron microscope as set forth in claim 3, wherein said slit position controller operates to control said moving mechanism on the basis of results of measurements made by said second measuring section for adjusting the position of the active energy-selecting slit through which the electron beam has passed, the position being taken in the direction of dispersion.

5. The electron microscope as set forth in claim 4,
   wherein said plural energy-selecting slits are arrayed in a first direction and have widths taken in a second direction perpendicular to the first direction, and
   wherein said slit position controller moves the slit plate in the first direction during the operation for changing the active energy-selecting slit and moves the slit plate in the second direction during the operation for adjusting the position of the active energy-selecting slit taken in the direction of dispersion.

6. The electron microscope as set forth in claim 3, wherein said slit position controller operates to adjust the position of said electron beam relative to said active energy-selecting slit taken in the direction of dispersion by controlling said energy filter on the basis of results of measurements made by said second measuring section.

7. A method of adjusting a monochromator included in an electron microscope, the monochromator having an energy filter for dispersing an electron beam emitted from an electron beam source according to energy and a slit plate which is disposed on an energy dispersive plane and which is provided with plural energy-selecting slits that are different in width taken in a direction where the electron beam is dispersed, said method comprising the steps of:
   measuring the intensity of the electron beam emitted from the electron beam source;
   measuring the intensity of the electron beam that has passed through an active one of the energy-selecting slits; and
   identifying the active energy-selecting slit from among the plural energy-selecting slits on the basis of both the measured intensity of the electron beam emitted from the electron beam source and the measured intensity of the electron beam that has passed through the active energy-selecting slit.

8. The method of adjusting a monochromator as set forth in claim 7, wherein during said step of identifying said active energy-selecting slit, this active energy-selecting slit is identified by finding its width, WL, using the following equation:

$$IL = \alpha \cdot WL \cdot It$$

where IL is the intensity of the electron beam which has passed through the active energy-selecting slit, It is the intensity of the electron beam emitted from the electron beam source, and $\alpha$ is a proportional constant.

9. The method of adjusting a monochromator as set forth in claim 7, further comprising the steps of:
   making a decision as to whether the active energy-selecting slit identified by the step of identifying the active energy-selecting slit is coincident with a desired one of the plural energy-selecting slits; and
   moving the position of the slit plate on the basis of the result of the decision to change the active energy-selecting slit through which the electron beam passes.

10. The method of adjusting a monochromator as set forth in claim 7, further comprising the step of:
   moving the position of the slit plate on the basis of the intensity of the electron beam which has passed through the active energy-selecting slit to adjust the position of the active energy-selecting slit through which the electron beam has passed, the position being taken in the direction of dispersion.

11. The method of adjusting a monochromator as set forth in claim 10,
   wherein said plural energy-selecting slits are arrayed in a first direction and have widths taken in a second direction perpendicular to the first direction,
   wherein during said step of changing the active energy-selecting slit through which the electron beam passes, the slit plate is moved in the first direction, and
   wherein during said step of adjusting the position of the active energy-selecting slit taken in the direction of dispersion, the slit plate is moved in the second direction.

12. The method of adjusting a monochromator as set forth in claim 7, further comprising the step of:

controlling the energy filter on the basis of the intensity of the electron beam which has passed through the active energy-selecting slit to adjust the position of the electron beam relative to the active energy-selecting slit taken in the direction of dispersion.

* * * * *